US011363705B2

(12) United States Patent
Osanai et al.

(10) Patent No.: US 11,363,705 B2
(45) Date of Patent: Jun. 14, 2022

(54) EXTREME ULTRAVIOLET LIGHT GENERATION APPARATUS, EXTREME ULTRAVIOLET LIGHT GENERATION SYSTEM, AND ELECTRONIC DEVICE MANUFACTURING METHOD

(71) Applicant: Gigaphoton Inc., Tochigi (JP)

(72) Inventors: Takayuki Osanai, Oyama (JP); Atsushi Ueda, Oyama (JP); Koichiro Koge, Oyama (JP); Akihiro Ohsawa, Kanagawa (JP); Toshiya Shintani, Kanagawa (JP); Yoshiaki Yoshida, Kanagawa (JP); Yuki Ishida, Kanagawa (JP); Yosuke Takada, Kanagawa (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/156,186

(22) Filed: Jan. 22, 2021

(65) Prior Publication Data

US 2021/0298160 A1    Sep. 23, 2021

(30) Foreign Application Priority Data

Mar. 18, 2020  (JP) .............................. JP2020-048339

(51) Int. Cl.
*H05G 2/00* (2006.01)
*H01J 37/32* (2006.01)
*G03F 7/20* (2006.01)

(52) U.S. Cl.
CPC ......... *H05G 2/006* (2013.01); *H01J 37/3244* (2013.01); *H05G 2/008* (2013.01); *G03F 7/70025* (2013.01); *G03F 7/70033* (2013.01)

(58) Field of Classification Search
CPC ..... H05G 2/006; H05G 2/008; H01J 37/3244; G03F 7/70025; G03F 7/70033
See application file for complete search history.

(56) References Cited

U.S. PATENT DOCUMENTS

| 2012/0119116 A1 | 5/2012 | Kakizaki et al. |
| 2014/0217311 A1 | 8/2014 | Nishisaka |
| 2016/0252821 A1 | 9/2016 | De Jong et al. |
| 2019/0364654 A1 | 11/2019 | Ueda et al. |

FOREIGN PATENT DOCUMENTS

| WO | 2018127565 A2 | 7/2018 |
| WO | 2018179417 A1 | 10/2018 |

OTHER PUBLICATIONS

A Search Report issued by the Netherlands Patent Office dated Jul. 21, 2021, which corresponds to Dutch Patent Application No. 2027449 and is related to U.S. Appl. No. 17/156,186; with English language Written Opinion.

*Primary Examiner* — Nicole M Ippolito
*Assistant Examiner* — Hanway Chang
(74) *Attorney, Agent, or Firm* — Studebaker & Brackett PC

(57) ABSTRACT

An extreme ultraviolet light generation apparatus may include a chamber device, a concentrating mirror, a central gas supply port configured to supply gas along a focal line passing through a first focal point and a second focal point from the center side of the reflection surface, and a first peripheral gas supply port disposed at a peripheral portion of the reflection surface and configured to supply gas in a direction from the outer side of the reflection surface toward the inner side of the reflection surface. The first peripheral gas supply port may supply gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

18 Claims, 15 Drawing Sheets

EXTREME ULTRAVIOLET LIGHT GENERATION APPARATUS, EXTREME ULTRAVIOLET LIGHT GENERATION SYSTEM, AND ELECTRONIC DEVICE MANUFACTURING METHOD

CROSS-REFERENCE TO RELATED APPLICATIONS

The present application claims the benefit of Japanese Patent Application No. 2020-048339, filed on Mar. 18, 2020, the entire contents of which are hereby incorporated by reference.

BACKGROUND

1. Technical Field

The present disclosure relates to an extreme ultraviolet light generation apparatus, an extreme ultraviolet light generation system, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As an EUV light generation apparatus, a laser produced plasma (LPP) type apparatus in which plasma generated by irradiating a target substance with laser light is used has been developed.

LIST OF DOCUMENTS

Patent Documents

Patent Document 1: International Publication No. WO2018/127565
Patent Document 2: International Publication No. WO2018/179417

SUMMARY

An extreme ultraviolet light generation apparatus according to an aspect of the present disclosure includes a chamber device including a plasma generation region in which plasma is generated from a droplet to which laser light is radiated, a concentrating mirror disposed in the chamber device as including a spheroidal reflection surface configured to reflect extreme ultraviolet light generated from the plasma in the plasma generation region, a central gas supply port configured to supply gas along a focal line passing through a first focal point and a second focal point of the reflection surface from a center side of the reflection surface, and a first peripheral gas supply port disposed at a peripheral portion of the reflection surface and configured to supply gas in the direction toward an inner side of the reflection surface from an outer side of the reflection surface. The first peripheral gas supply port is configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

An extreme ultraviolet light generation system according to another aspect of the present disclosure includes a chamber device including a plasma generation region in which plasma is generated from a droplet to which laser light is radiated, a laser device configured to irradiate the droplet with the laser light in the plasma generation region, a concentrating mirror disposed in the chamber device as including a spheroidal reflection surface configured to reflect extreme ultraviolet light generated from the plasma in the plasma generation region, a central gas supply port configured to supply gas along a focal line passing through a first focal point and a second focal point of the reflection surface from a center side of the reflection surface, and a first peripheral gas supply port disposed at a peripheral portion of the reflection surface and configured to supply gas along the direction toward an inner side of the reflection surface from an outer side of the reflection surface. The first peripheral gas supply port is configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

An electronic device manufacturing method according to another aspect of the present disclosure includes generating plasma by irradiating a droplet with laser light using an extreme ultraviolet light generation apparatus, emitting the extreme ultraviolet light generated from the plasma to the exposure apparatus, and exposing a photosensitive substrate to the extreme ultraviolet light in the exposure apparatus to produce an electronic device. The extreme ultraviolet light generation apparatus includes a chamber device including a plasma generation region in which plasma is generated from the droplet to which the laser light is radiated, a concentrating mirror disposed in the chamber device as including a spheroidal reflection surface configured to reflect extreme ultraviolet light generated from the plasma in the plasma generation region, a central gas supply port configured to supply gas along a focal line passing through a first focal point and a second focal point of the reflection surface from a center side of the reflection surface, and a first peripheral gas supply port disposed at a peripheral portion of the reflection surface and configured to supply gas along the direction toward an inner side of the reflection surface from an outer side of the reflection surface. The first peripheral gas supply port is configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

BRIEF DESCRIPTION OF THE DRAWINGS

Embodiments of the present disclosure will be described below merely as examples with reference to the accompanying drawings.

DESCRIPTION OF EMBODIMENTS

Figure 1:
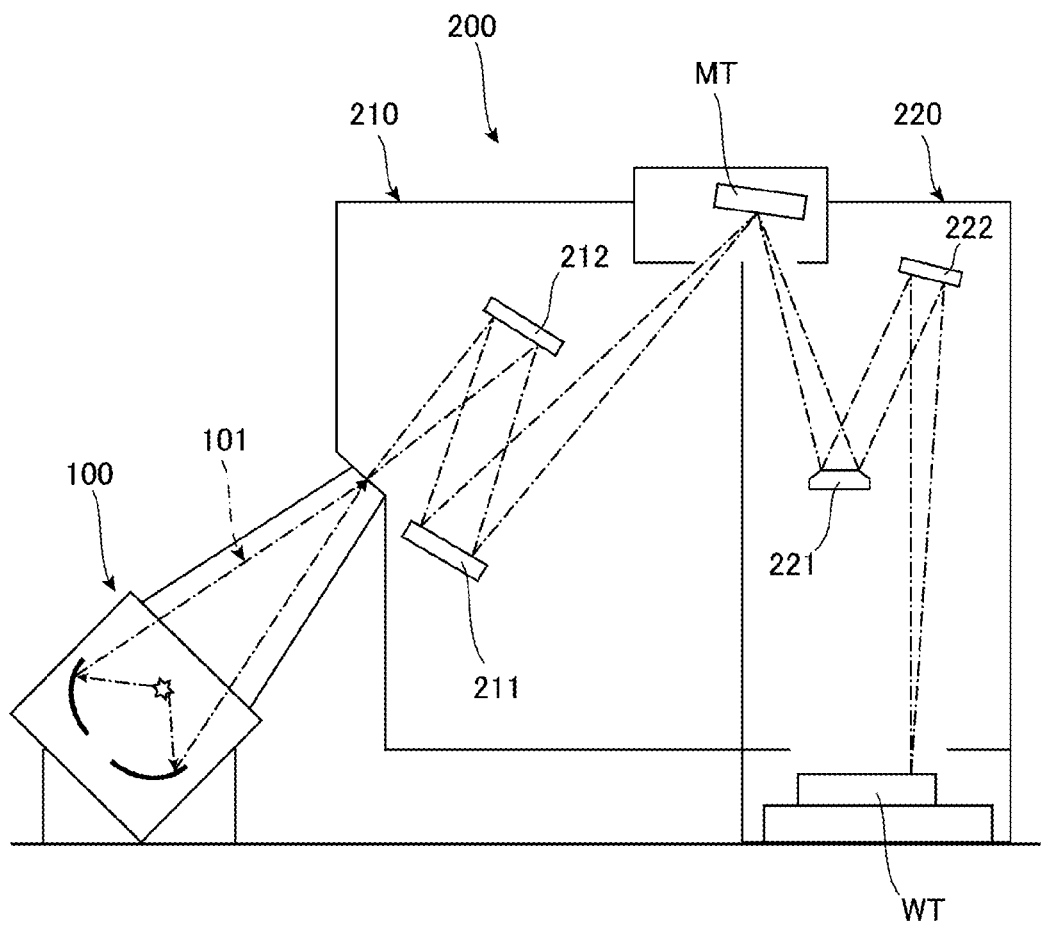
FIG. 1 is a view illustrating an exemplary entire schematic configuration of an electronic device manufacturing apparatus.

1. Overview
2. Description of electronic device manufacturing apparatus
3. Description of extreme ultraviolet light generation system of comparative example
    3.1 Configuration
    3.2 Operation
    3.3 Problem
4. Description of EUV light generation apparatus of Embodiment 1
    4.1 Configuration
    4.2 Operation
    4.3 Effect
5. Description of EUV light generation apparatus of Embodiment 2
    5.1 Configuration
    5.2 Effect
6. Description of EUV light generation apparatus of Embodiment 3
    6.1 Configuration
    6.2 Effect Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) light, an extreme ultraviolet light generation system, and an electronic device manufacturing apparatus. In the following, extreme ultraviolet light is referred to as EUV light in some cases.

2. Description of Electronic Device Manufacturing Apparatus

As illustrated in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not illustrated) disposed on a workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

3. Description of Extreme Ultraviolet Light Generation System of Comparative Example 3.1 Configuration An EUV light generation system 110 of a comparative example will be described. The comparative example of the present disclosure is an example recognized by the applicant as known only by the applicant, and is not a publicly known example admitted by the applicant.

Figure 2:
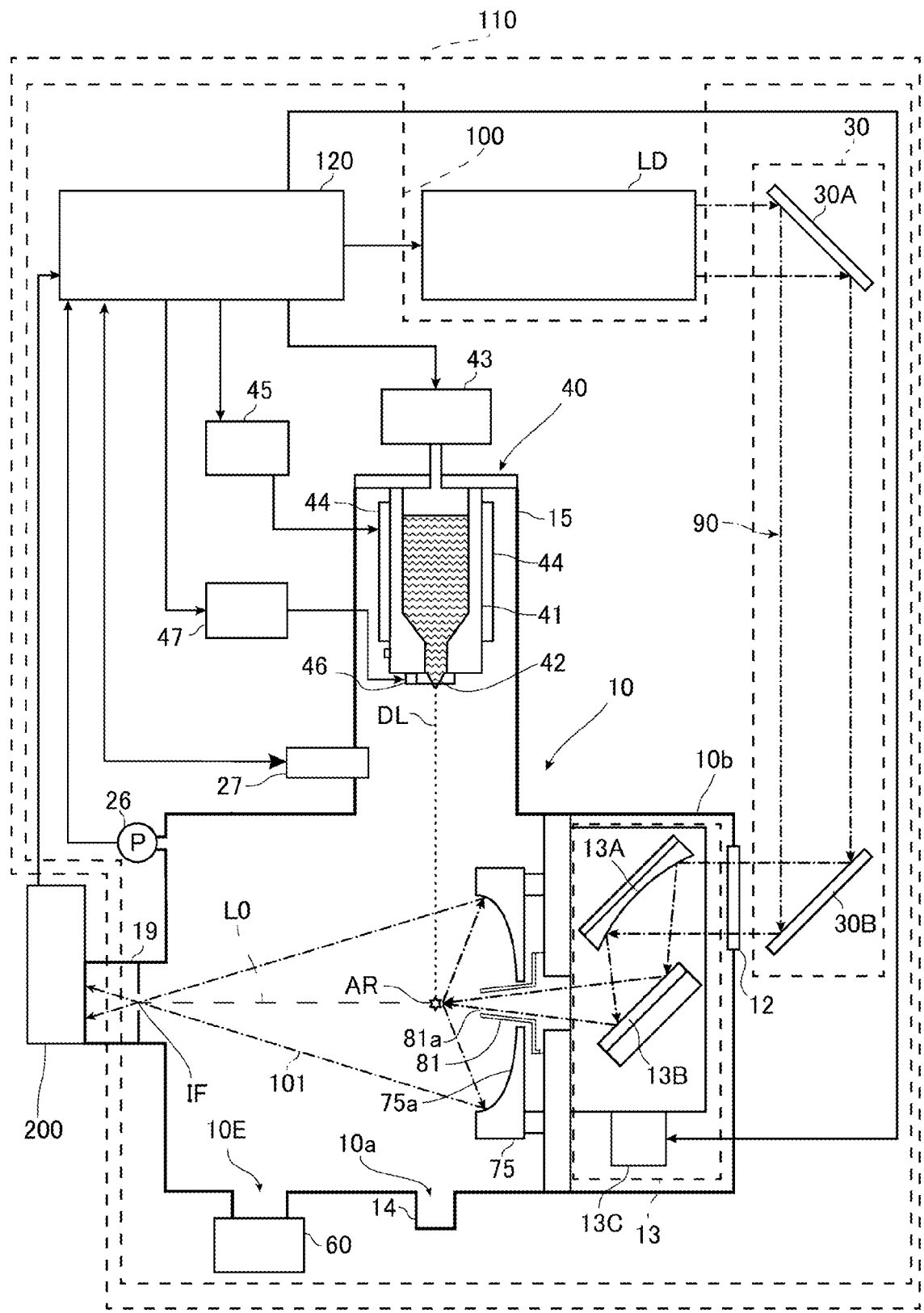
FIG. 2 is a view illustrating an exemplary entire schematic configuration of an extreme ultraviolet light generation system.

FIG. 2 is a view illustrating an exemplary entire schematic configuration of the EUV light generation system 110 of the present example. As illustrated in FIG. 2, the EUV light generation system 110 includes the EUV light generation apparatus 100 and a laser device LD as a main configuration. The EUV light generation apparatus 100 includes a chamber device 10, a processor 120, and a laser light delivery optical system 30 as a main configuration. In FIG. 2, some of the configuration of the chamber device 10, such as a plurality of first peripheral gas supply units 83, a plurality of second peripheral gas supply units 85, and a plurality of third peripheral gas supply units 87, is omitted.

The chamber device 10 is a sealable container. The chamber device 10 includes an inner wall 10b surrounding an internal space having a low pressure atmosphere. The chamber device 10 includes a sub-chamber 15, and a target supply unit 40 is provided in the sub-chamber 15. The target supply unit 40 includes a tank 41 and a nozzle 42. The target supply unit 40 supplies a droplet DL to the internal space of the chamber device 10 and is attached, for example, to penetrate through a wall of the sub-chamber 15. The droplet DL, which is also called a target, is supplied from the target supply unit 40.

The tank 41 stores therein a target substance that becomes the droplet DL. The target substance contains tin. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts. The pressure adjuster 43 and the heater power source 45 are electrically connected to the processor 120.

The nozzle 42 is attached to the tank 41 and discharges the target substance. A piezoelectric element 46 is attached to the nozzle 42. The piezoelectric element 46 is electrically connected to a piezoelectric power source 47 and is driven by voltage applied from the piezoelectric power source 47. The piezoelectric power source 47 is electrically connected to the processor 120. The target substance discharged from the nozzle 42 is formed into the droplet DL through operation of the piezoelectric element 46.

The chamber device 10 also includes a target collection unit 14. The target collection unit 14 is a box body attached to the inner wall 10b of the chamber device 10. The target collection unit 14 communicates with the internal space of the chamber device 10 through an opening 10a formed in the inner wall 10b of the chamber device 10. The target collection unit 14 and the opening 10a are disposed directly below the nozzle 42. The target collection unit 14 is a drain tank to collect any unnecessary droplet DL passing through the opening 10a and reaching the target collection unit 14 and to accumulate the unnecessary droplet DL.

At least one through hole is formed in the wall of the chamber device 10. The through-hole is blocked by a window 12 through which pulsed laser light 90 emitted from the laser device LD passes.

Further, a laser light concentrating optical system 13 is located in the internal space of the chamber device 10. The laser light concentrating optical system 13 includes a laser light concentrating mirror 13A and a high reflection mirror 13B. The laser light concentrating mirror 13A reflects and concentrates the laser light 90 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber device 10 coincides with a position specified by the processor 120.

For example, an EUV light concentrating mirror 75 having a spheroidal reflection surface 75a is disposed inside the chamber device 10. The reflection surface 75a reflects the EUV light 101 generated from plasma in a plasma generation region AR. The reflection surface 75a has a first focal point and a second focal point. The reflection surface 75a may be disposed such that, for example, the first focal point is located in the plasma generation region AR and the second focal point is located at an intermediate focal point IF. Here, a straight line passing through the first focal point and the second focal point is illustrated as a focal line L0. A through-hole is formed at a center of the EUV light concentrating mirror 75, and the pulsed laser light 90 passes through the through-hole.

Further, the EUV light generation apparatus 100 includes a connection portion 19 providing communication between the internal space of the chamber device 10 and an internal space of the exposure apparatus 200. A wall in which an aperture is formed is provided inside the connection portion 19. The wall is preferably arranged such that the aperture is located at the second focal point.

Further, the EUV light generation apparatus 100 includes a pressure sensor 26 and a target sensor 27. The pressure sensor 26 and the target sensor 27 are attached to the chamber device 10 and are electrically connected to the processor 120. The pressure sensor 26 measures pressure in the internal space of the chamber device 10. The target sensor 27 has, for example, an imaging function, and detects the presence, trajectory, position, speed, and the like of the droplet DL according to an instruction from the processor 120.

The laser device LD includes a master oscillator being a light source to perform a burst operation. The master oscillator emits the pulsed laser light 90 in a burst-on duration. The master oscillator is, for example, a laser device configured to emit the laser light 90 by exciting, through electric discharge, gas as mixture of carbon dioxide gas with helium, nitrogen, or the like. Alternatively, the master oscillator may be a quantum cascade laser device. The master oscillator may emit the pulsed laser light 90 by a Q switch system. Further, the master oscillator may include an optical switch, a polarizer, and the like. In the burst operation, the continuous pulsed laser light 90 is emitted at a predetermined repetition frequency in the burst-on duration and the emission of the laser light 90 is stopped in a burst-off duration.

The travel direction of the laser light 90 emitted from the laser device LD is adjusted by the laser light delivery optical system 30. The laser light delivery optical system 30 includes a plurality of mirrors 30A and 30B for adjusting the travel direction of the laser light 90, and a position of at least one of the mirrors 30A and 30B is adjusted by an actuator (not illustrated). Owing to that the position of at least one of the mirrors 30A and 30B is adjusted, the laser light 90 can appropriately propagate to the internal space of the chamber device 10 through the window 12.

The processor 120 controls the entire EUV light generation apparatus 100 and also controls the laser device LD. The processor 120 receives a signal related to the pressure in the internal space of the chamber device 10, which is measured by the pressure sensor 26, a signal related to image data of the droplet DL captured by the target sensor 27, a burst signal from the exposure apparatus 200, and the like. The processor 120 processes the image data and the like, and may control, for example, timing at which the droplet DL is output, an output direction of the droplet DL, and the like. Further, the processor 120 may control oscillation timing of the laser device LD, the travel direction of the laser light 90, the concentrating position of the laser light 90, and the like. Such various kinds of control described above are merely exemplary, and other control may be added as necessary, as described later.

Next, a configuration of the chamber device 10 will be described in more detail.

Figure 3:
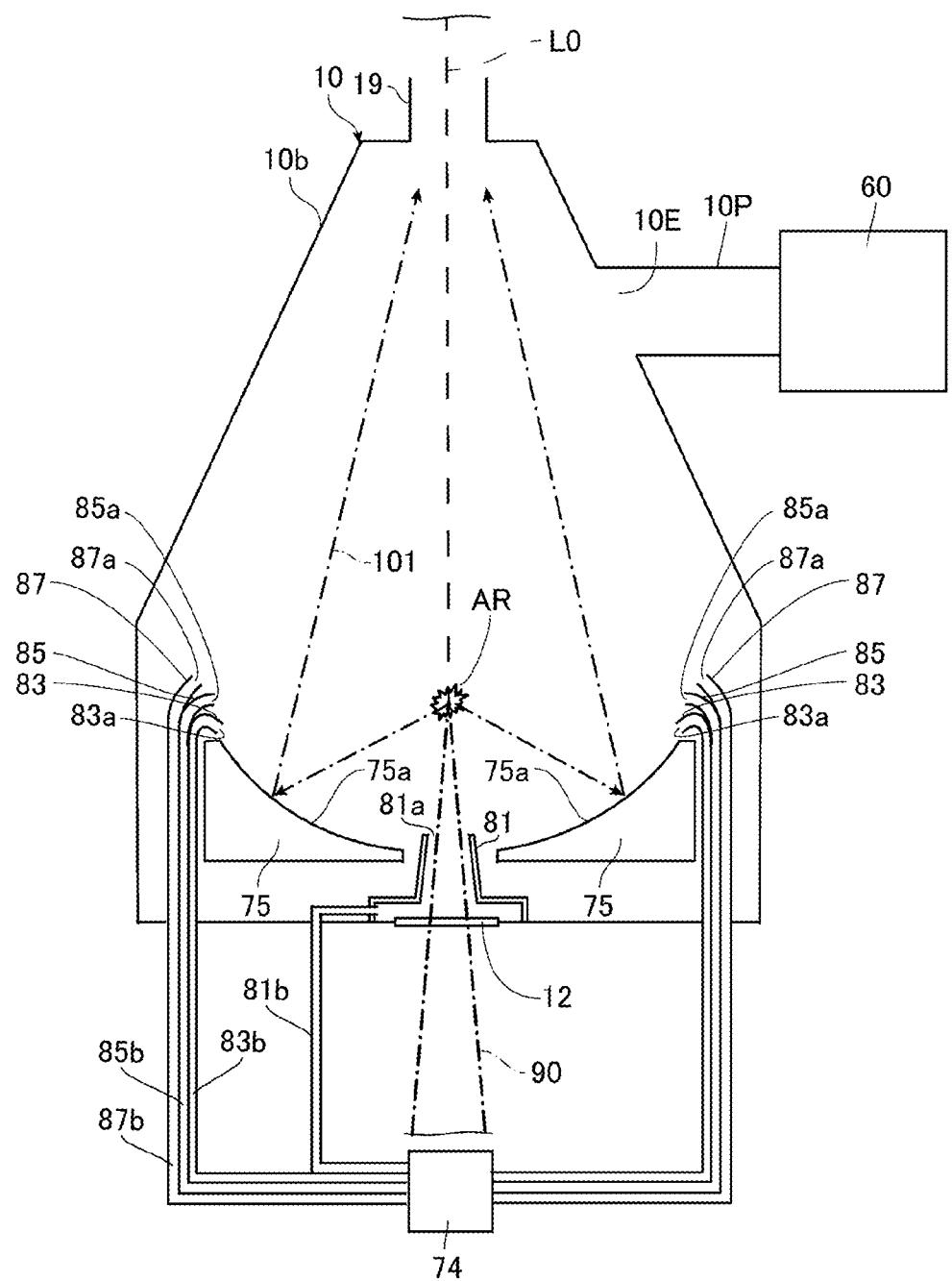
FIG. 3 is a view illustrating an exemplary schematic configuration of a part including a chamber device in a comparative example.

FIG. 3 is a view illustrating an exemplary schematic configuration of a part including the chamber device 10. In FIG. 3, some of the configuration of the chamber device 10, such as the laser light concentrating optical system 13, the target supply unit 40, and the target collection unit 14 is omitted. A central gas supply unit 81, the plurality of first peripheral gas supply units 83, the plurality of second peripheral gas supply units 85, and the plurality of third peripheral gas supply units 87, which supply the etching gas into the internal space of the chamber device 10, are disposed in the chamber device 10. As described above, since the target substance contains tin, the etching gas is, for example, hydrogen-containing gas having a hydrogen gas concentration of 100% in effect. Alternatively, the etching gas may be, for example, a balance gas having a hydrogen gas concentration of about 3%. The balance gas contains nitrogen ($N_2$) gas and argon (Ar) gas. Tin fine particles and tin charged particles are generated when the target substance forming the droplet DL is turned into plasma in the plasma generation region AR by being irradiated with the laser light 90. The etching gas contains hydrogen that reacts with tin constituting the fine particles and charged particles. Through the reaction with hydrogen, tin becomes stannane ($SnH_4$) gas at room temperature.

The central gas supply unit 81 has a shape of a side surface of a circular truncated cone and is called a cone in some cases. The central gas supply unit 81 is inserted through the through hole formed in the center of the EUV light concentrating mirror 75. The central gas supply unit 81 has a central gas supply port 81a being a nozzle. The central gas supply port 81a supplies the etching gas from the center side of the reflection surface 75a toward the plasma generation region AR. The central gas supply port 81a preferably supplies the etching gas in the direction away from the reflection surface 75a from the center side of the reflection surface 75a along the focal line L0 passing through the first focal point and the second focal point of the reflection surface 75a. The focal line L0 is extended along the center axis direction of the reflection surface 75a. The central gas supply port 81a is connected to the gas supply device 74 being a tank for supplying the etching gas through a pipe 81b of the central gas supply unit 81. A supply gas flow rate adjusting unit (not illustrated) may be provided in the pipe 81b. The laser light 90 passes through the through hole of the EUV light concentrating mirror 75 through the central gas supply unit 81, as described above. Thus, the laser light 90 can pass through on the window 12 side of the central gas supply unit 81.

The plurality of first peripheral gas supply units 83, the plurality of second peripheral gas supply units 85, and the plurality of third peripheral gas supply units 87 supply the etching gas from the gas supply device 74 toward the internal space of the chamber device 10 from the peripheral portion of the reflection surface 75a.

Each of the first peripheral gas supply units 83, the second peripheral gas supply units 85, and the third peripheral gas supply units 87 is provided with a peripheral gas supply port being a nozzle.

Here, description will be provided on a first peripheral gas supply port 83a of the first peripheral gas supply unit 83, a second peripheral gas supply port 85a of the second peripheral gas supply unit 85, and a third peripheral gas supply port 87a of the third peripheral gas supply unit 87.

The first peripheral gas supply port 83a is connected to the gas supply device 74 through a pipe 83b of the first peripheral gas supply unit 83, the second peripheral gas supply port 85a is connected to the gas supply device 74 through a pipe 85b of the second peripheral gas supply unit 85, and the third peripheral gas supply port 87a is connected to the gas supply device 74 through a pipe 87b of the third peripheral gas supply unit 87. The gas supply device 74 is driven and controlled by the processor 120. The pipes 83b, 85b, and 87b may have an unillustrated supply gas flow regulator.

The first peripheral gas supply ports 83a, the second peripheral gas supply ports 85a, and the third peripheral gas supply ports 87a are provided on a peripheral portion of the reflection surface 75a. In the center axis direction of the reflection surface 75a, among the first peripheral gas supply ports 83a, the second peripheral gas supply ports 85a, and the third peripheral gas supply ports 87a, the first peripheral gas supply ports 83a are formed closest to the reflection surface 75a, and the third peripheral gas supply ports 87a are formed farthest from the reflection surface 75a. Further, in the center axis direction of the reflection surface 75a, the second peripheral gas supply ports 85a are formed between the first peripheral gas supply ports 83a and the third peripheral gas supply ports 87a, and are formed on the side opposite to the reflection surface 75a with respect to the first peripheral gas supply ports 83a. Therefore, it may be understood that the third peripheral gas supply ports 87a are formed on the side opposite to the first peripheral gas supply ports 83a with respect to the second peripheral gas supply ports 85a. Here, the first peripheral gas supply ports 83a, the second peripheral gas supply ports 85a, and the third peripheral gas supply ports 87a are disposed on the side lateral to the plasma generation region AR.

As illustrated in FIG. 3, the first peripheral gas supply ports 83a are formed as facing the center of the reflection surface 75a. The first peripheral gas supply ports 83a supply the etching gas so that the etching gas from the first peripheral gas supply ports 83a flows toward the center of the reflection surface 75a from the peripheral portion of the reflection surface 75a along the reflection surface 75a.

Figure 4:
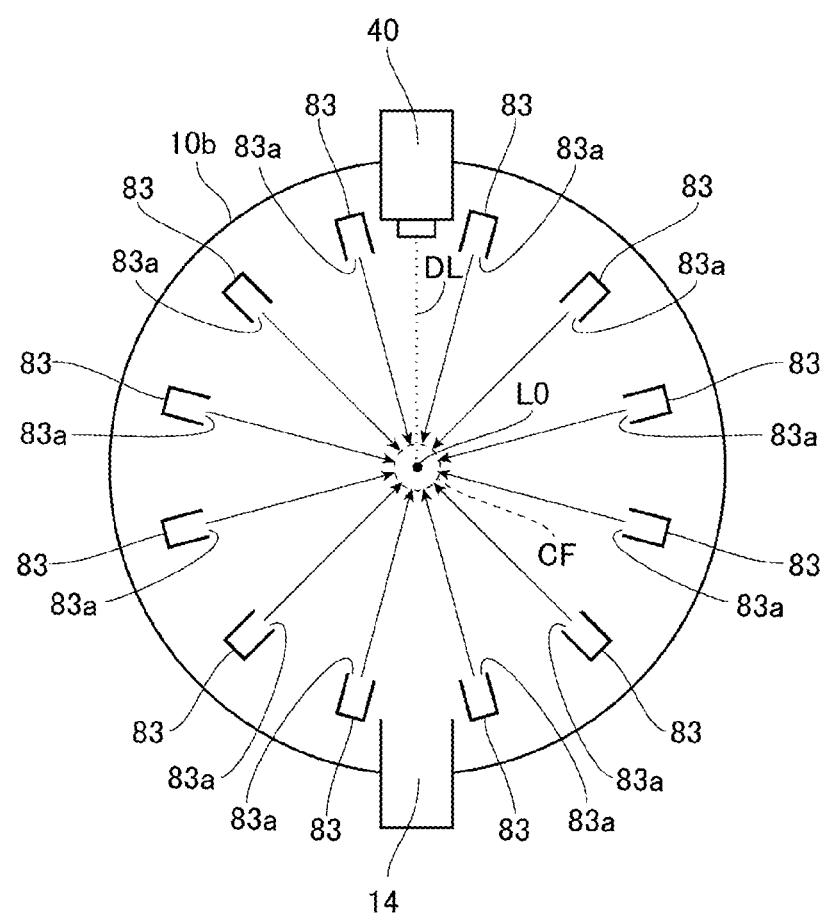
FIG. 4 is a view of a configuration of a plurality of first peripheral gas supply ports in the comparative example as viewed along a focal line.

FIG. 4 is a view illustrating a configuration of the plurality of first peripheral gas supply ports 83a as viewed along the focal line L0. As illustrated in FIG. 4, the plurality of first peripheral gas supply ports 83a are formed on the circumference of the same circle with reference to the focal line L0. The first peripheral gas supply ports 83a are formed at equal intervals in the circumferential direction of the circle. The first peripheral gas supply ports 83a are formed as facing the focal line L0, supply the etching gas in the direction from the outer side of the reflection surface 75a toward the inner side of the reflection surface 75a, and supply the etching gas toward the focal line L0. Therefore, the first peripheral gas supply ports 83a supply the etching gas in the direction approaching the focal line L0. In the comparative example, the direction from the outer side of the reflection surface 75a toward the inner side of the reflection surface 75a is the radial direction of the reflection surface 75a. In FIG. 4, CF illustrates flow of the etching gas supplied from the central gas supply port 81a along the focal line L0. Solid arrows illustrated in FIG. 4 indicate flow of the etching gas from the first peripheral gas supply port 83a toward the focal line L0. When the etching gas is supplied from the central gas supply port 81a and the first peripheral gas supply ports 83a, the etching gas from the first peripheral gas supply ports 83a flows toward the etching gas from the central gas supply port 81a. The first peripheral gas supply ports 83a are formed on the same plane as the target supply unit 40 and the target collection unit 14, and are not located between the target supply unit 40 and the target collection unit 14.

As illustrated in FIG. 3, the second peripheral gas supply ports 85a are disposed on the side lateral to the plasma generation region AR and are formed as facing the plasma generation region AR. The second peripheral gas supply ports 85a supply the etching gas from the peripheral portion of the reflection surface 75a to the plasma generation region AR so that the etching gas from the second peripheral gas supply ports 85a flows toward the plasma generation region AR from the peripheral portion of the reflection surface 75a.

Further, as illustrated in FIG. 3, when viewed from the direction perpendicular to the focal line L0, the third peripheral gas supply ports 87a are formed as facing in the direction away from the reflection surface 75a. The third peripheral gas supply ports 87a supply the etching gas in the direction away from the reflection surface 75a so that etching gas from the third peripheral gas supply ports 87a flows in the direction away from the reflection surface 75a. The third peripheral gas supply ports 87a may supply the etching gas toward the second focal point where the intermediate focal point IF is located.

Figure 5:
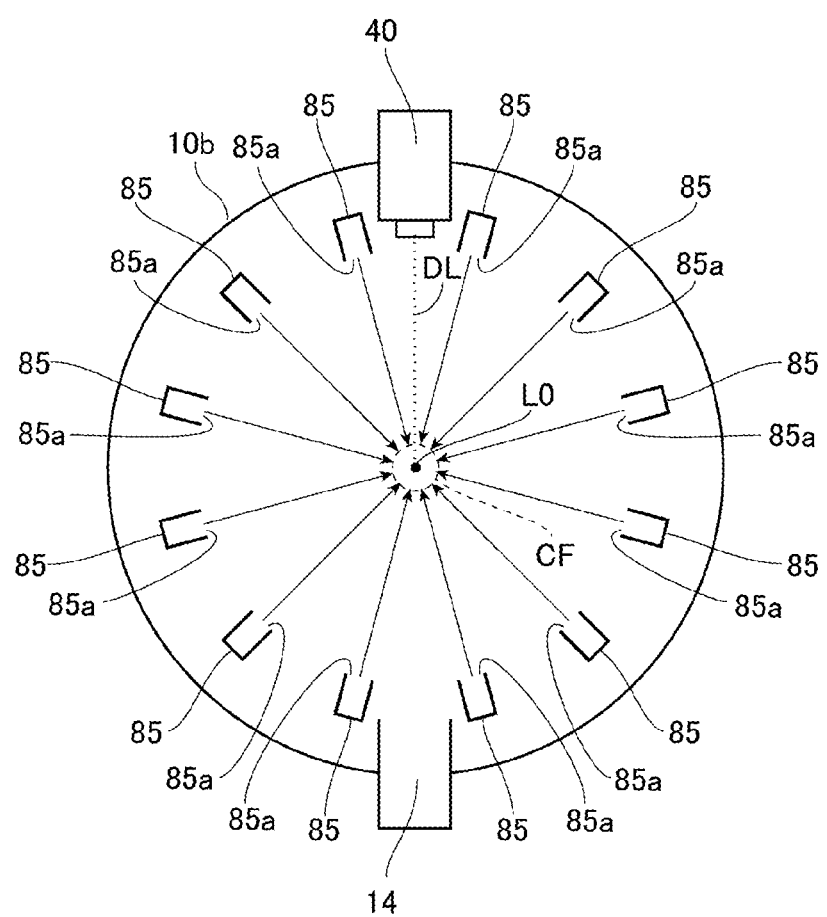
FIG. 5 is a view of a configuration of a plurality of second peripheral gas supply ports in the comparative example as viewed along the focal line.
Figure 6:
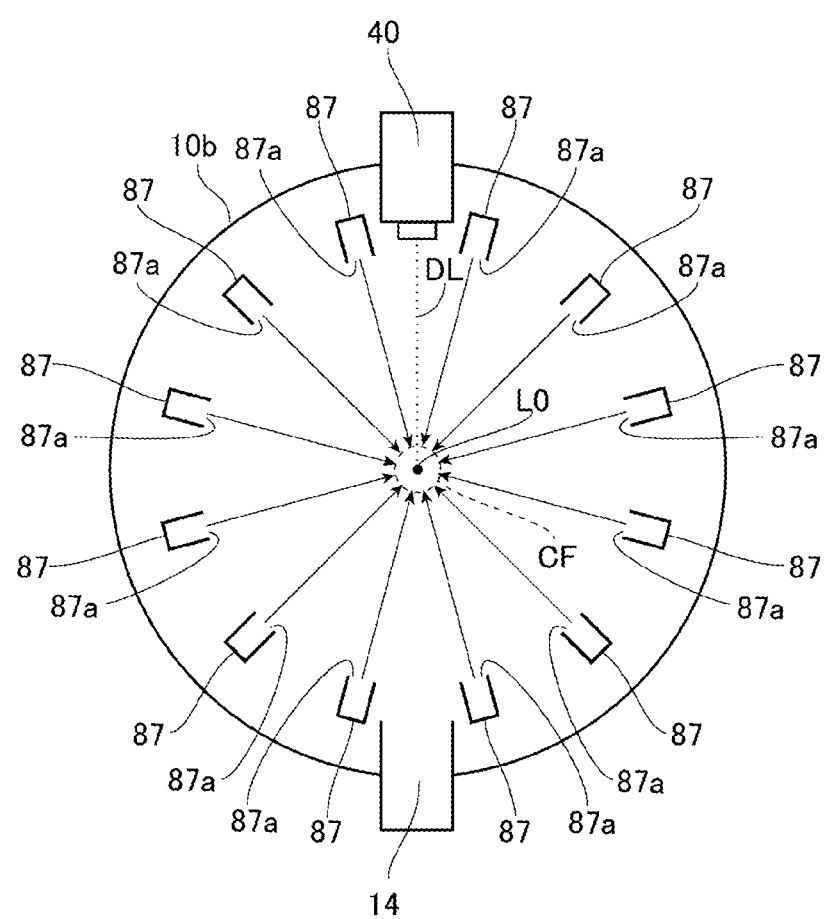
FIG. 6 is a view of a configuration of a plurality of third peripheral gas supply ports in the comparative example as viewed along the focal line.

FIG. 5 is a view of a configuration of the plurality of second peripheral gas supply ports 85a as viewed along the focal line L0. FIG. 6 is a view of a configuration of the plurality of third peripheral gas supply ports 87a as viewed along the focal line L0. As illustrated in FIGS. 5 and 6, the plurality of second peripheral gas supply ports 85a and the plurality of third peripheral gas supply ports 87a are formed on the circumference of the same circle with reference to the focal line L0, similarly to the plurality of first peripheral gas supply ports 83a. The second peripheral gas supply ports 85a and the third peripheral gas supply ports 87a are formed respectively at equal intervals in the circumferential direction of the circle. The second peripheral gas supply ports 85a and the third peripheral gas supply ports 87a are formed as facing the focal line L0, supply the etching gas in the direction from the outer side of the reflection surface 75a toward the inner side of the reflection surface 75a, and supply the etching gas toward the focal line L0. Therefore, the second peripheral gas supply ports 85a and the third peripheral gas supply ports 87a supply the etching gas in the direction approaching the focal line L0. In FIGS. 5 and 6, CF illustrates flow of the etching gas supplied from the central gas supply port 81a. Solid arrows illustrated in FIG. 5 indicate flow of the etching gas from the second peripheral gas supply ports 85a toward the focal line L0. Further, solid arrows illustrated in FIG. 6 indicate flow of the etching gas from the third peripheral gas supply ports 87a toward the focal line L0. When the etching gas is supplied from the central gas supply port 81a, the second peripheral gas supply ports 85a, and the third peripheral gas supply ports 87a, the etching gas from the second peripheral gas supply ports 85a and the etching gas from the third peripheral gas supply ports 87a flow toward the etching gas from the central gas supply port 81a. The second peripheral gas supply ports 85a and the third peripheral gas supply ports 87a are formed on the same plane as the target supply unit 40 and the target collection unit 14, and are not located between the target supply unit 40 and the target collection unit 14.

Returning to FIG. 3, description of the chamber device 10 will be continued. An exhaust port 10E is disposed in the chamber device 10. The exhaust port 10E exhausts residual gas to be described later in the internal space of the chamber device 10. For example, the exhaust port 10E is disposed in the inner wall 10b of the chamber device 10. The exhaust port 10E is connected to an exhaust pipe 10P, and the exhaust pipe 10P is connected to an exhaust pump 60.

When the target substance is turned into plasma, the residual gas as exhaust gas is generated in the internal space of the chamber device 10. The residual gas contains tin fine particles and charged particles generated through the plasma generation from the target substance, stannane generated through the reaction of the tin fine particles and tin charged particles with the etching gas, and unreacted etching gas. Some of the charged particles are neutralized in the internal space of the chamber device 10, and the residual gas contains the neutralized charged particles as well. The exhaust pump 60 sucks the residual gas through the exhaust port 10E and the exhaust pipe 10P.

3.2 Operation

Next, operation of the EUV light generation apparatus 100 of the comparative example will be described. In the EUV light generation apparatus 100, for example, at the time of new installation or maintenance or the like, atmospheric air in the internal space of the chamber device 10 is exhausted. At this time, purging and exhausting of the internal space of the chamber device 10 may be repeated for exhausting the atmospheric components. For example, inert gas such as nitrogen ($N_2$) or argon (Ar) is preferably used for the purge gas. Thereafter, when the pressure of the internal space of the chamber device 10 is equal to or less than a predetermined pressure, the processor 120 starts introduction of the etching gas from the gas supply device 74 to the internal space of the chamber device 10 through the central gas supply unit 81, the plurality of first peripheral gas supply units 83, the plurality of second peripheral gas supply units 85, and the plurality of third peripheral gas supply units 87. At this time, the processor 120 may control a supply gas flow rate adjusting unit (not illustrated) and the exhaust pump 60 so that the pressure in the internal space of the chamber device 10 is maintained at a predetermined pressure. Thereafter, the processor 120 waits until a predetermined time elapses from the start of introduction of the etching gas.

Further, the processor 120 drives an electromagnet of a magnetic field generating unit (not illustrated) to generate a magnetic field. Further, the processor 120 causes the exhaust pump 60 to exhaust the gas in the internal space of the chamber device 10 from the exhaust port 10E, and keeps the pressure in the internal space of the chamber device 10 substantially constant based on the signal of the pressure in the internal space of the chamber device 10 measured by the pressure sensor 26.

In order to heat and maintain the target substance in the tank 41 at a predetermined temperature equal to or higher than the melting point, the processor 120 causes the heater power source 45 to apply current to the heater 44 to increase temperature of the heater 44. In this case, the processor 120 controls temperature of the target substance to the predetermined temperature by adjusting a value of the current applied from the heater power source 45 to the heater 44 based on an output from a temperature sensor (not illustrated). Note that the predetermined temperature is, for example, 250° C. to 290° C. when the target substance is tin.

Further, the processor 120 causes the pressure adjuster 43 to adjust the pressure in the tank 41 so that the melted target substance is discharged through the hole of the nozzle 42 at a predetermined speed. The target substance discharged through the hole of the nozzle 42 may be in the form of jet. At this time, the processor 120 causes the piezoelectric power source 47 to apply a voltage having a predetermined waveform to the piezoelectric element 46 to generate the droplet DL. Vibration of the piezoelectric element 46 can propagate through the nozzle 42 to the target substance to be discharged through the hole of the nozzle 42. The target substance is divided at a predetermined cycle by the vibration, and a liquid droplet DL is generated from the target substance.

Further, the processor 120 outputs a light emission trigger signal to the laser device LD. When the light emission trigger signal is input, the laser device LD emits the pulsed laser light 90. The emitted laser light 90 is incident on the laser light concentrating optical system 13 through the laser light delivery optical system 30 and the window 12. At this time, the processor 120 controls the laser light manipulator 13C of the laser light concentrating optical system 13 such that the laser light 90 is concentrated in the plasma generation region AR. The processor 120 causes the laser device LD to emit the laser light 90 based on a signal from the target sensor 27 so that the droplet DL is irradiated with the laser light 90. Thus, the droplet DL is irradiated in the plasma generation region AR with the laser light 90 concentrated by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 through the connection portion 19. Thus, it may be understood that the connection portion 19 is an emission port of the EUV light 101 in the EUV light generation apparatus 100.

When the target substance is turned into plasma, charged particles of tin are generated as described above. The charged particles receive Lorentz force from the magnetic field and move while drawing trajectories that rotate in a plane perpendicular to the magnetic lines. In the case where the moving charged particles include velocity components in the direction toward the exhaust port 10E, the charged particles move toward the wall of the chamber device 10 while converging in the spiral trajectories along the magnetic lines. Therefore, most of the charged particles are guided to the exhaust port 10E formed in the wall of the chamber device 10 in the vicinity of a convergence portion of the magnetic field and flow into the exhaust port 10E.

In addition, when the target substance is turned into plasma, electrically neutral tin fine particles are generated as described above. Since the fine particles are not affected by the magnetic field generated by the magnetic field generation unit, the fine particles diffuse into the internal space of the chamber device 10. Some of the fine particles diffused into the internal space of the chamber device 10 may adhere to the reflection surface 75a. The fine particles adhering to the reflection surface 75a react with the hydrogen-containing etching gas supplied from the plurality of first peripheral gas supply units 83 to become stannane. Further, the fine particles diffusing into the internal space of the chamber device 10 react with the hydrogen-containing etching gas supplied from the central gas supply unit 81, the plurality of first peripheral gas supply units 83, the plurality of second peripheral gas supply units 85, and the plurality of third peripheral gas supply units 87 to become stannane. Most of the stannane obtained through the reaction with the etching gas flows into the exhaust port 10E along with the flow of the unreacted etching gas.

Further, at least some of the charged particles not converging into the exhaust port 10E due to the magnetic field and the fine particles not adhering to the reflection surface 75a may become stannane through reaction with some of the unreacted etching gas flowing in the internal space of the chamber device 10. Most of the stannane generated through the reaction flows into the exhaust port 10E along with the flow of the unreacted etching gas. Further, at least some of the unreacted charged particles, fine particles, and etching gas flow into the exhaust port 10E.

The unreacted etching gas, fine particles, charged particles, stannane, and the like having flowed into the exhaust port 10E flow as residual gas through the exhaust pipe 10p into the exhaust pump 60 and are subjected to predetermined exhaust treatment such as detoxification.

In the comparative example, the processor 120 starts introduction of the etching gas from the gas supply device 74 to the internal space of the chamber device 10 through the central gas supply unit 81, the plurality of first peripheral gas supply units 83, the plurality of second peripheral gas supply units 85, and the plurality of third peripheral gas supply units 87.

In the central gas supply unit 81, the etching gas is supplied from the gas supply device 74 to the central gas supply port 81a through the pipe 81b, and is supplied from the central gas supply port 81a to the internal space of the chamber device 10. The supplied etching gas flows in the direction away from the reflection surface 75a along the focal line L0. The flowing etching gas flows toward the exhaust port 10E together with the residual gas in the internal space of the chamber device 10, and is sucked from the exhaust port 10E to the exhaust pump 60 through the exhaust pipe 10p together with the residual gas.

In the first peripheral gas supply units 83, the etching gas is supplied from the gas supply device 74 to the first peripheral gas supply ports 83a through the pipe 83b, and is supplied from the first peripheral gas supply ports 83a to the internal space of the chamber device 10. The supplied etching gas flows toward the center of the reflection surface 75a along the reflection surface 75a from the peripheral portion of the reflection surface 75a. The etching gas flowing along the reflection surface 75a cools the reflection surface 75a and suppresses thermal deformation of the reflection surface 75a due to the light generated from the plasma. Further, the etching gas flowing along the reflection surface 75a suppresses adhesion of tin to the reflection surface 75a. In the internal space of the chamber device 10, tin may be precipitated from the residual gas heated by the light generated from plasma. Specifically, some of the stannane contained in the residual gas may be returned to tin through heating. If tin is precipitated from the residual gas in the internal space of the chamber device 10 and the tin adheres to the reflection surface 75a, the reflectivity of the reflection surface 75a is reduced, and concentration of the EUV light 101 toward the intermediate focal point IF by the reflection surface 75a may be obstructed by the tin. However, as described above, since adhesion of tin is suppressed by the etching gas flowing along the reflection surface 75a, the EUV light 101 is concentrated at the intermediate focal point IF.

Further, in the second peripheral gas supply units 85, the etching gas is supplied from the gas supply device 74 to the second peripheral gas supply ports 85a through the pipe 85b of the second peripheral gas supply units 85, and is supplied to the internal space of the chamber device 10 from the second peripheral gas supply ports 85a. The supplied etching gas flows toward the plasma generation region AR.

Further, in the third peripheral gas supply units 87, the etching gas is supplied from the gas supply device 74 to the third peripheral gas supply ports 87a through the pipe 87b, and is supplied from the third peripheral gas supply ports 87a to the internal space of the chamber device 10.

The etching gas from the first peripheral gas supply ports 83a, the second peripheral gas supply ports 85a, and the third peripheral gas supply ports 87a flows in the direction away from the reflection surface 75a together with the etching gas from the central gas supply port 81a. Further, as described above, when the target substance is turned into plasma, residual gas as exhaust gas is generated in the internal space of the chamber device 10. Therefore, the etching gas from the first peripheral gas supply ports 83a, the second peripheral gas supply ports 85a, and the third peripheral gas supply ports 87a flows toward the exhaust port 10E together with the etching gas from the central gas supply port 81a and the residual gas in the internal space of the chamber device 10, and is sucked from the exhaust port 10E to the exhaust pump 60 together with the etching gas from the central gas supply port 81a and the residual gas through the exhaust pipe 10P.

3.3 Problem

As illustrated in FIG. 4, for example, the first peripheral gas supply ports 83a are formed as facing the focal line L0, and supply the etching gas toward the focal line L0. Here, the central gas supply port 81a supplies the etching gas along the focal line L0. Therefore, there is concern that some of the etching gas from the first peripheral gas supply ports 83a collides with the etching gas from the central gas supply port 81a. The collision may disturb the flow of the etching gas, and there is concern that the droplets DL vibrate in the plasma generation region AR due to the disturbance of the flow of the etching gas.

When the droplet DL vibrates, accuracy of irradiation of the droplet DL with the laser light is decreased. In this case, for example, the droplet DL may be irradiated with the laser light at an unintentional position and there is concern that the EUV light 101 may not be generated. Alternatively, the droplet DL may not be irradiated with the laser light and there is concern that the EUV light 101 is not generated. Further, it is conceivable that the droplet DL flows in an unintended direction without traveling to the target collection unit 14 due to vibration. In this case, a structural element of the internal space of the chamber device 10, such as the reflection surface 75a, may be contaminated by the droplet DL. Such contamination of the structural element of the internal space of the chamber device 10 may cause failure of the chamber device 10.

Therefore, in the following embodiments, the EUV light generation apparatus 100 is exemplified in which failure of the chamber device 10 due to the collision can be suppressed by suppressing the collision of the etching gas supplied to the internal space of the chamber device 10 from the central gas supply port and the peripheral gas supply ports.

4. Description of EUV light generation apparatus of Embodiment 1

Next, a configuration of the EUV light generation apparatus 100 of Embodiment 1 will be described. Any component same as that described above is denoted by an identical reference sign, and duplicate description thereof is omitted unless specific description is needed.

4.1 Configuration

Figure 7:
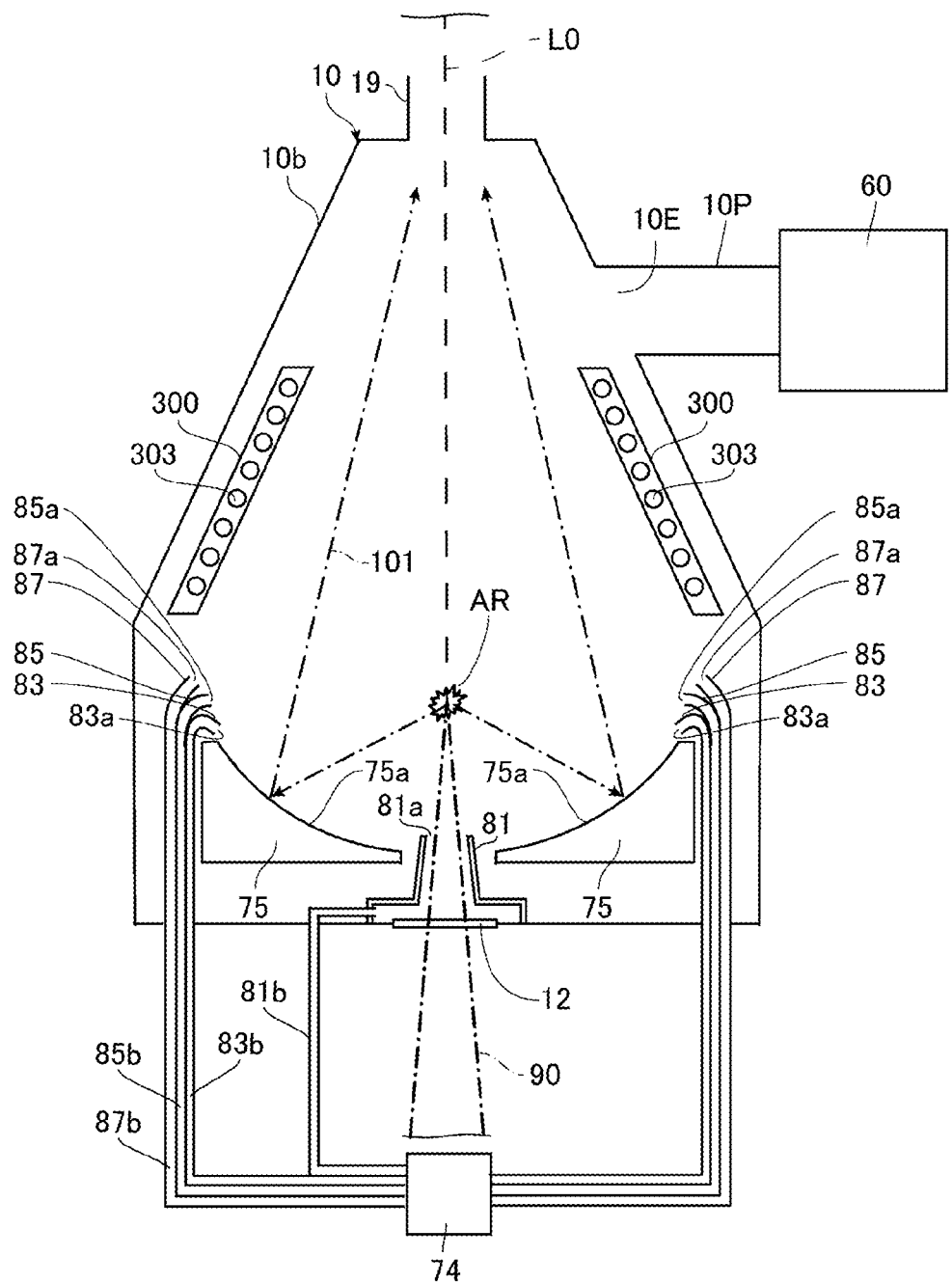
FIG. 7 is a view illustrating an exemplary schematic configuration of a part including the chamber device in Embodiment 1.

FIG. 7 is a view illustrating a schematic exemplary configuration of a part including the chamber device 10 in the present embodiment. In FIG. 7, similarly to FIG. 3, some of the configuration of the chamber device 10 such as the laser light concentrating optical system 13, the target supply unit 40, and the target collection unit 14 is omitted.

As illustrated in FIG. 7, the chamber device 10 further includes a heat shield 300 disposed in the internal space of the chamber device 10. The heat shield 300 is disposed between the inner wall 10b of the chamber device 10 and the plasma generation region AR. The heat shield 300 is formed of, for example, a metal such as aluminum.

The heat shield 300 is, for example, cylindrical. The heat shield 300 is irradiated with light generated from the plasma generated by irradiation of the droplet DL with the laser light 90. The heat shield 300 is irradiated with light instead of the inner wall 10b of the chamber device 10, thereby suppressing thermal deformation of the inner wall of the chamber device 10 due to light. The light includes, for example, at least one of emitted light incidentally emitted from the plasma along with generation of the plasma, and scattered light being the laser light 90 that is scattered by the target substance. The light may include EUV light.

The heat shield 300 is fixed to the inner wall 10b of the chamber device 10 through a damper (not illustrated). The damper is made of a material in which stress of expansion and deformation of the heat shield 300 due to heat is less likely to be transmitted to the inner wall 10b of the chamber device 10.

The heat shield 300 is further provided with a flow path portion 303. The flow path portion 303 is a hole formed in the wall portion of the heat shield 300. A cooling medium flows inside the flow path portion 303. The cooling medium suppresses thermal deformation of the heat shield 300 due to the light including at least one of emitted light and scattered light. For example, the cooling medium is water and temperature of the water is 5° C.

Figure 8:
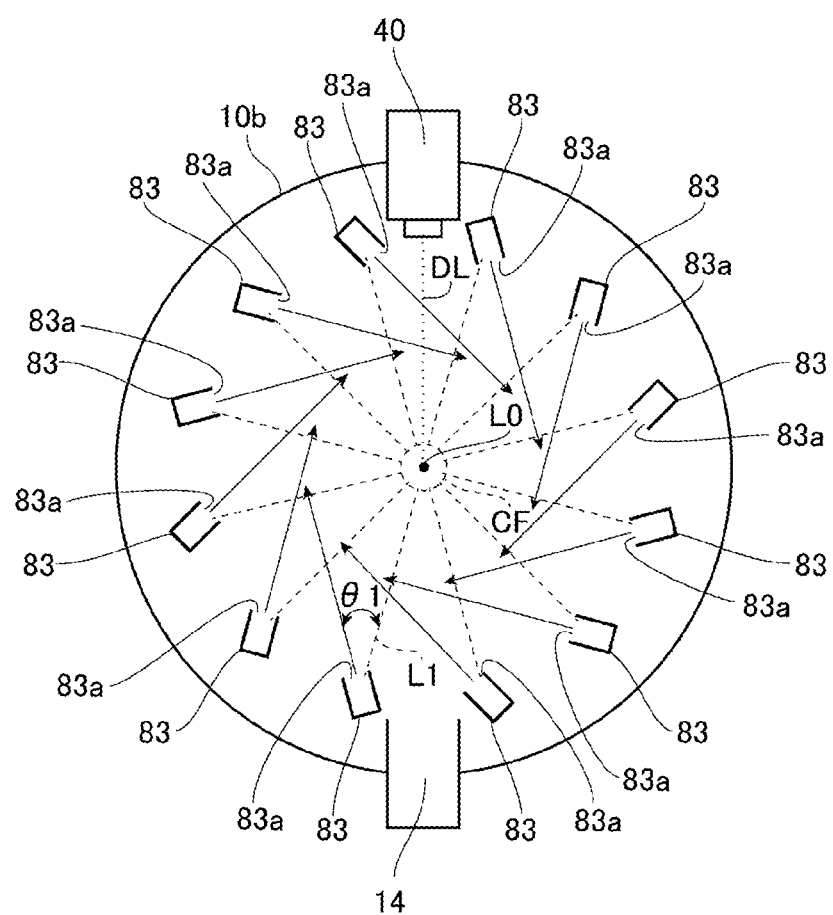
FIG. 8 is a view of a configuration of a plurality of the first peripheral gas supply ports in Embodiment 1 as viewed along the focal line.

FIG. 8 is a view of a configuration of the plurality of first peripheral gas supply ports 83a in the present embodiment as viewed along the focal line L0. In the chamber device 10 of the present embodiment, arrangement of the first peripheral gas supply ports 83a is different from arrangement of the first peripheral gas supply port 83a of the comparative example.

Each of the first peripheral gas supply ports 83a is formed as facing in an inclined direction inclined, with respect to a first straight line L1 indicated by a broken line passing through the first peripheral gas supply port 83a and the focal line L0, toward the tangential direction of the peripheral portion at the peripheral portion of the reflection surface 75a where the first peripheral gas supply port 83a is located. The first peripheral gas supply port 83a is inclined at an inclination angle θ1 with respect to the first straight line L1. The inclination angle θ1 is, for example, 5° to 45°. The inclination angle θ1 is preferably, for example, 5° to 15°. In the present embodiment, the respective first peripheral gas supply ports 83a have the identical inclination angle θ1 and are inclined toward the same side. The respective first peripheral gas supply ports 83a supply the etching gas so that the etching gas supplied from the respective first peripheral gas supply ports 83a swirls around the etching gas from the central gas supply port 81a. Further, in the present embodiment, similarly to the comparative example, the first peripheral gas supply ports 83a supply the etching gas in the direction toward the inner side of the reflection surface 75a along the reflection surface 75a from the peripheral portion of the reflection surface 75a. Here, unlike the radial direction of the reflection surface 75a described above as being the direction in the comparative example, the direction in the present embodiment toward the inner side of the reflection surface 75a from the outer side of the reflection surface 75a is inclined at the inclination angle θ1 with respect to the first straight line L1 as described above. The flow velocity of the etching gas supplied from the first peripheral gas supply ports 83a is preferably, for example, 600 m/s or less.

Figure 9:
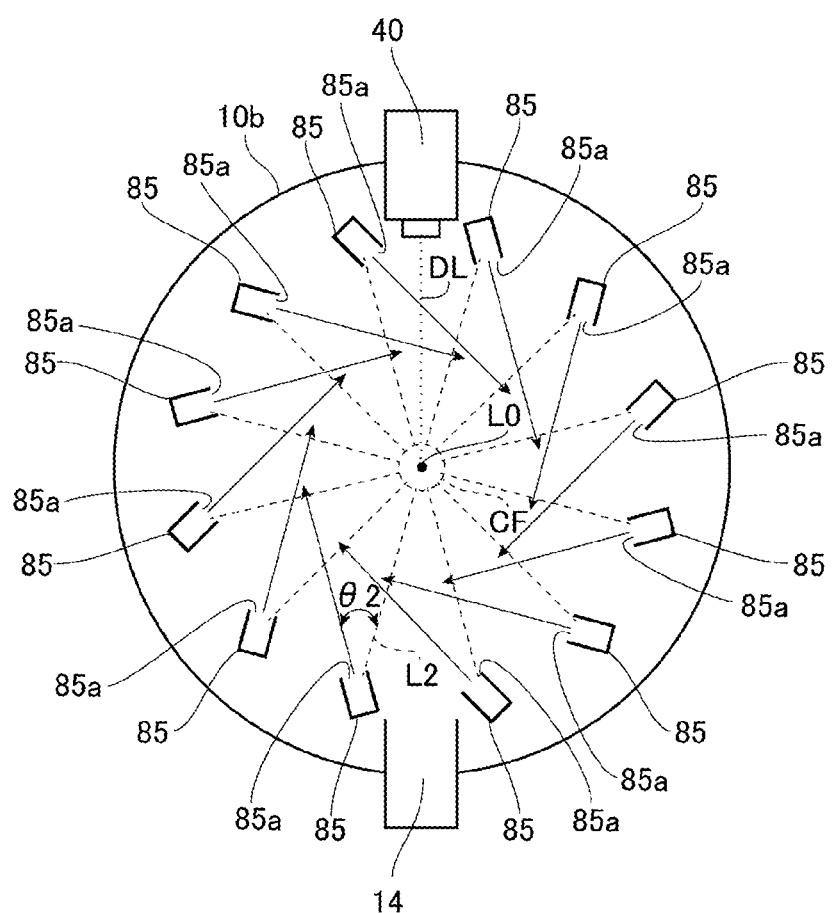
FIG. 9 is a view of a configuration of a plurality of the second peripheral gas supply ports in Embodiment 1 as viewed along the focal line.

FIG. 9 is a view of a configuration of the plurality of second peripheral gas supply ports 85a in the present embodiment as viewed along the focal line L0. In the chamber device 10 of the present embodiment, arrangement of the second peripheral gas supply ports 85a is different from arrangement of the second peripheral gas supply ports 85a of the comparative example.

Each of the second peripheral gas supply ports 85a is formed as facing in an inclined direction inclined, with respect to a second straight line L2 indicated by a broken line passing through the second peripheral gas supply port 85a and the focal line L0, toward the tangential direction of the peripheral portion at the peripheral portion of the reflection surface 75a where the second peripheral gas supply port 85a is located. The second peripheral gas supply port 85a is inclined at an inclination angle θ2 with respect to the second straight line L2. In the present embodiment, the respective second peripheral gas supply ports 85a have the identical inclination angle θ2 and are inclined toward the same side. Further, the second peripheral gas supply ports 85a are inclined toward the same side as the first peripheral gas supply ports 83a. The respective second peripheral gas supply ports 85a supply the etching gas so that the etching gas supplied from the respective second peripheral gas supply ports 85a flows in the same direction as the etching gas supplied from the respective first peripheral gas supply ports 83a and the etching gas supplied from the respective second peripheral gas supply ports 85a swirls around the etching gas from the central gas supply port 81a. Further, in the present embodiment, similarly to the comparative example, the second peripheral gas supply ports 85a supply the etching gas in the direction from the peripheral portion of the reflection surface 75a toward the inner side of the reflection surface 75a. In the present embodiment, the inclination angle θ2 of the second peripheral gas supply ports 85a is the same as the inclination angle θ1 of the first peripheral gas supply ports 83a. The flow velocity of the etching gas supplied from the second peripheral gas supply ports 85a is preferably the same as the flow velocity of the etching gas supplied from the first peripheral gas supply ports 83a. The number of the second peripheral gas supply ports 85a is the same as the number of the first peripheral gas supply ports 83a.

Figure 10:
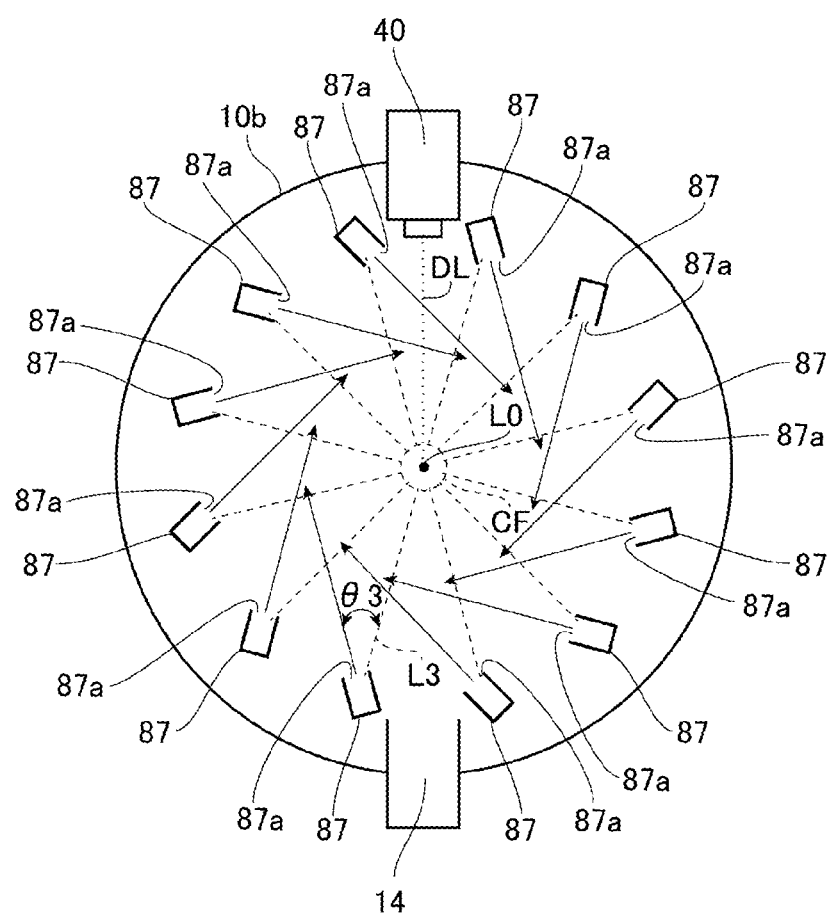
FIG. 10 is a view of a configuration of a plurality of the third peripheral gas supply ports in Embodiment 1 as viewed along the focal line.

FIG. 10 is a view of a configuration of the plurality of third peripheral gas supply ports 87a in the present embodiment as viewed along the focal line L0. In the chamber device 10 of the present embodiment, arrangement of the third peripheral gas supply ports 87a is different from arrangement of the third peripheral gas supply ports 87a of the comparative example.

Each of the third peripheral gas supply port 87a is formed as facing in an inclined direction inclined, with respect to a third straight line L3 indicated by a broken line passing through the third peripheral gas supply port 87a and the focal line L0, toward the tangential direction of the peripheral portion at the peripheral portion of the reflection surface 75a where the third peripheral gas supply port 87a is located. The third peripheral gas supply port 87a is inclined at an inclination angle θ3 with respect to the third straight line L3. In the present embodiment, the respective third peripheral gas supply ports 87a have the identical inclination angle θ3 and are inclined toward the same side. Further, the third peripheral gas supply ports 87a are inclined toward the same side as the first peripheral gas supply ports 83a. The respective third peripheral gas supply ports 87a supply the etching gas so that the etching gas supplied from the respective third peripheral gas supply ports 87a flows in the same direction as the etching gas supplied from the respective first peripheral gas supply ports 83a and the etching gas supplied from the respective third peripheral gas supply ports 87a swirls around the etching gas from the central gas supply port 81a. Further, in the present embodiment, similarly to the comparative example, the third peripheral gas supply ports 87a supply the etching gas in the direction from the peripheral portion of the reflection surface 75a toward the inner side of the reflection surface 75a. In the present embodiment, the inclination angle θ3 of the third peripheral gas supply ports 87a is the same as the inclination angle θ1 of the first peripheral gas supply ports 83a. The flow velocity of the etching gas supplied from the third peripheral gas supply ports 87a is preferably the same as the flow velocity of the etching gas supplied from the first peripheral gas supply ports 83a. The number of the third peripheral gas supply ports 87a is the same as the number of the first peripheral gas supply ports 83a.

4.2 Operation

Next description will be provided on operation of the plurality of first peripheral gas supply units 83, the plurality of second peripheral gas supply units 85, and the plurality of third peripheral gas supply units 87 in the present embodiment.

In the present embodiment, similarly to the comparative example, in the first peripheral gas supply unit 83, the etching gas is supplied from the gas supply device 74 to the first peripheral gas supply ports 83a through the pipe 83b, and is supplied from the first peripheral gas supply ports 83a to the internal space of the chamber device 10. The supplied etching gas flows from the peripheral portion of the reflection surface 75a to the inner side of the reflection surface 75a along the reflection surface 75a. The etching gas flowing along the reflection surface 75a cools the reflection surface 75a and suppresses thermal deformation of the reflection surface 75a due to the light generated from the plasma. Further, the etching gas flowing along the reflection surface 75a suppresses adhesion of tin to the reflection surface 75a. Thus, decrease in reflectance of the reflection surface 75a is suppressed, and the EUV light 101 is concentrated at the intermediate focal point IF.

In the present embodiment, when viewed along the focal line L0, the first peripheral gas supply ports 83a are inclined respectively toward the same side at the same inclination angle θ1. Therefore, the etching gas from the first peripheral gas supply ports 83a swirls around the etching gas from the central gas supply port 81a, and flows in the direction away from the reflection surface 75a along the focal line L0 together with the etching gas from the central gas supply port 81a. The flowing etching gas flows toward the exhaust port 10E together with the residual gas in the internal space of the chamber device 10, and is sucked from the exhaust port 10E to the exhaust pump 60 through the exhaust pipe 10p together with the residual gas.

Further, in the present embodiment, in the second peripheral gas supply units 85, the etching gas is supplied from the gas supply device 74 to the second peripheral gas supply ports 85a through the pipe 85b of the second peripheral gas supply units 85, and is supplied to the internal space of the chamber device 10 from the second peripheral gas supply ports 85a.

In the present embodiment, when viewed along the focal line L0, the second peripheral gas supply ports 85a are inclined toward the same side at the same inclination angle θ2 being the same as the inclination angle θ1. The etching gas from the second peripheral gas supply ports 85a swirls around the etching gas from the central gas supply port 81a, and flows in the direction away from the reflection surface 75a along the focal line L0 together with the etching gas from the central gas supply port 81a. The flowing etching gas flows toward the exhaust port 10E together with the residual gas in the internal space of the chamber device 10, and is sucked from the exhaust port 10E to the exhaust pump 60 through the exhaust pipe 10p together with the residual gas.

Further, in the present embodiment, similarly to the comparative example, in the third peripheral gas supply units 87, the etching gas is supplied from the gas supply device 74 to the third peripheral gas supply ports 87a through the pipe 87b, and is supplied to the internal space of the chamber device 10 from the third peripheral gas supply ports 87a. Further, the etching gas is supplied in the direction away from the reflection surface 75a.

In the present embodiment, when viewed along the focal line L0, the third peripheral gas supply ports 87a are inclined toward the same side at the same inclination angle θ3 being the same as the inclination angle θ1. The etching gas from the third peripheral gas supply ports 87a swirls around the etching gas from the central gas supply port 81a, and flows in the direction away from the reflection surface 75a along the focal line L0 together with the etching gas from the central gas supply port 81a. The flowing etching gas flows toward the exhaust port 10E together with the residual gas in the internal space of the chamber device 10, and is sucked from the exhaust port 10E to the exhaust pump 60 through the exhaust pipe 10p together with the residual gas.

The etching gas from the first peripheral gas supply ports 83a, the second peripheral gas supply ports 85a, and the third peripheral gas supply ports 87a swirls around the etching gas from the central gas supply port 81a. Therefore, collision of the etching gas from the first peripheral gas supply ports 83a, the second peripheral gas supply ports 85a, and the third peripheral gas supply ports 87a with the etching gas from the central gas supply port 81a is suppressed. When the collision is suppressed, flow turbulence of the etching gas due to the collision is suppressed, and vibration of the droplet DL in the plasma generation region AR due to the turbulence is suppressed.

Further, the residual gas in the internal space of the chamber device 10 flows toward the exhaust port 10E due to the etching gas from the central gas supply port 81a, the first peripheral gas supply ports 83a, the second peripheral gas supply ports 85a, and the third peripheral gas supply ports 87a, and is sucked to the exhaust pump 60 through the exhaust pipe 10p from the exhaust port 10E. Therefore, similarly to the comparative example, generation of tin and adhesion of tin to the reflection surface 75a, the inner wall 10b, and the heat shield 300 are suppressed.

When plasma is generated in the plasma generation region AR by irradiating the droplet DL with the laser light 90, light other than EUV light is generated from the plasma as well. The light includes, for example, at least one of emitted light and scattered light. The heat shield 300 is irradiated with the light. Accordingly, since the irradiation of the inner wall 10b of the chamber device 10 with light is suppressed, thermal deformation of the inner wall 10b of the chamber device 10 due to light is suppressed. Further, the heat shield 300 is cooled by the cooling medium flowing through the flow path portion 303, and the thermal deformation of the heat shield 300 due to light is suppressed by the cooling medium.

Here, when tin generated from the residual gas adheres to the inner wall of the heat shield 300, the heat shield 300 may be thermally deformed due to the light radiated to the tin. However, as described above, the residual gas is fed toward the exhaust pump 60 through the exhaust port 10E. Therefore, generation of tin from the residual gas is suppressed, adhesion of tin to the heat shield 300 is suppressed, and the thermal deformation of the heat shield 300 can be suppressed. Further, when the adhering tin falls from the inner wall of the heat shield 300, a structural element of the internal space of the chamber device 10 such as the reflection surface 75a may be contaminated by the falling tin. Such contamination of the structural element of the internal space of the chamber device 10 may cause failure of the chamber device 10. However, as described above, the residual gas flows toward the exhaust port 10E due to the etching gas, and is sucked from the exhaust port 10E to the exhaust pump 60 through the exhaust pipe 10p together with the residual gas. Therefore, generation of tin can be suppressed, adhesion of tin to the heat shield 300 can be suppressed, and failure of the chamber device 10 can be suppressed.

Further, for example, the etching gas from the third peripheral gas supply ports 87a flows along the inner wall of the heat shield 300. The etching gas flowing along the inner wall of the heat shield 300 cools the inner wall of the heat shield 300 and suppresses thermal deformation of the heat shield 300 due to the light generated from the plasma. Further, the etching gas flowing along the inner wall of the heat shield 300 suppresses adhesion of tin to the inner wall of the heat shield 300.

4.3 Effect

In the EUV light generation apparatus 100 of the present embodiment, the central gas supply port 81a supplies the etching gas from the center side of the reflection surface 75a along the focal line L0. Further, when viewed along the focal line L0, the first peripheral gas supply ports 83a supply the etching gas in an inclined direction inclined to the tangential direction side at the peripheral portion of the reflection surface 75a with respect to the corresponding first straight line L1.

Therefore, collision of the etching gas from the first peripheral gas supply ports 83a with the etching gas from the central gas supply port 81a is suppressed. When the collision is suppressed, flow turbulence of the etching gas due to the collision is suppressed, and vibration of the droplet DL in the plasma generation region AR due to the turbulence is suppressed. By suppressing the vibration, the droplet DL is irradiated with the laser light 90 at a predetermined position and the desired EUV light 101 is generated. Further, the suppression of the vibration suppresses the droplet DL from not being capable of being irradiated with the laser light 90 and the EUV light 101 from not being generated. Further, when the vibration is suppressed, the droplet DL travels to the target collection unit 14, and the droplet DL is suppressed from flowing in an unintended direction. Therefore, contamination of the structural element of the internal space of the chamber device 10 such as the reflection surface 75a due to the droplet DL is suppressed, and occurrence of failure of the chamber device 10 is suppressed.

Therefore, in the EUV light generation apparatus 100 of the present embodiment, by suppressing collision of the etching gas supplied to the internal space of the chamber device 10 from the central gas supply port 81a and the first peripheral gas supply ports 83a, it is possible to suppress failure of the chamber device 10 due to collision.

Further, in the EUV light generation apparatus 100 of the present embodiment, the first peripheral gas supply ports 83a supply the etching gas along the reflection surface 75a from the peripheral portion of the reflection surface 75a. Therefore, the reflection surface 75a is cooled by the etching gas flowing along the reflection surface 75a, and thermal deformation of the reflection surface 75a due to the light generated from the plasma can be suppressed. Further, the etching gas flowing along the reflection surface 75a can suppress adhesion of tin to the reflection surface 75a.

Further, in the EUV light generation apparatus 100 of the present embodiment, the second peripheral gas supply ports 85a supply the etching gas in the direction from the outer side of the reflection surface 75a toward the inner side of the reflection surface 75a. Further, the second peripheral gas supply ports 85a are formed on the side opposite to the reflection surface 75a with respect to the first peripheral gas supply ports 83a. Further, when viewed along the focal line L0, the second peripheral gas supply ports 85a supply the etching gas in an inclined direction inclined to the tangential direction side at the peripheral portion of the reflection surface 75a with respect to the corresponding second straight line L2 passing through the corresponding second peripheral gas supply port 85a and the focal line L0.

Therefore, collision of the etching gas from the second peripheral gas supply ports 85a with the etching gas from the central gas supply port 81a is suppressed. Therefore, even when the second peripheral gas supply ports 85a are formed, similarly to the first peripheral gas supply ports 83a, it is possible to suppress failure of the chamber device 10 due to collision.

Further, in the EUV light generation apparatus 100 of the present embodiment, the third peripheral gas supply ports 87a are formed on the opposite side to the first peripheral gas supply ports 83a with respect to the second peripheral gas supply ports 85a, and supply the etching gas in the direction from the outer side of the reflection surface 75a toward the inner side of the reflection surface 75a. When viewed from the direction perpendicular to the focal line L0, the third peripheral gas supply ports 87a supply the etching gas in the direction away from the reflection surface 75a.

The etching gas from the third peripheral gas supply ports 87a causes the residual gas in the internal space of the chamber device 10 to be away from the reflection surface 75a, and adhesion of tin to the reflection surface 75a can be suppressed.

Further, in the EUV light generation apparatus 100 of the present embodiment, when viewed along the focal line L0, the third peripheral gas supply ports 87a supply the etching gas in an inclined direction inclined to the tangential direction side at the peripheral portion of the reflection surface 75a with respect to the corresponding third straight line L3 passing through the corresponding third peripheral gas supply port 87a and the focal line L0.

Therefore, collision of the etching gas from the third peripheral gas supply ports 87a with the etching gas from the central gas supply port 81a is suppressed. Therefore, even when the third peripheral gas supply ports 87a are formed, similarly to the first peripheral gas supply ports 83a, it is possible to suppress failure of the chamber device 10 due to collision.

Further, in the EUV light generation apparatus 100 of the present embodiment, the inclination angle $\theta 1$ of the first peripheral gas supply ports 83a with respect to the first straight line L1 is the same as the inclination angle $\theta 2$ of the second peripheral gas supply ports 85a with respect to the second straight line L2. Further, when viewed along the focal line L0, the second peripheral gas supply ports 85a are inclined toward the same side as the first peripheral gas supply ports 83a.

Therefore, the etching gas from the second peripheral gas supply ports 85a flows in the same direction as the etching gas from the first peripheral gas supply ports 83a, and collision thereof can be suppressed. When the collision is suppressed, vibration of the droplet DL is suppressed. Therefore, contamination of the structural element of the internal space of the chamber device 10 such as the reflection surface 75a due to the droplet DL is suppressed, and occurrence of failure of the chamber device 10 is suppressed.

Further, in the EUV light generation apparatus 100 of the present embodiment, the inclination angles $\theta 1$ for the respective first peripheral gas supply ports 83a with respect to the corresponding first straight line L1 are identical to each other, and when viewed along the focal line L0, the respective first peripheral gas supply ports 83a are inclined toward the same side.

Therefore, collision of the etching gas from the respective first peripheral gas supply ports 83a is suppressed, and the etching gas from the respective first peripheral gas supply ports 83a can swirl around the etching gas from the central gas supply port 81a.

Further, in the EUV light generation apparatus 100 of the present embodiment, the inclination angles $\theta 2$ for the respective second peripheral gas supply ports 85a with respect to the corresponding second straight line L2 are identical to each other, and when viewed along the focal line L0, the respective second peripheral gas supply ports 85a are inclined toward the same side.

Therefore, collision of the etching gas from the respective second peripheral gas supply ports 85a is suppressed, and the etching gas from the respective second peripheral gas supply ports 85a can swirl around the etching gas from the central gas supply port 81a.

Further, in the EUV light generation apparatus 100 of the present embodiment, the heat shield 300 is disposed between the inner wall 10b of the chamber device 10 and the plasma generation region AR. Since the heat shield 300 is irradiated with light instead of the inner wall 10b, thermal deformation of the inner wall 10b of the chamber device 10 due to light is suppressed. Further, the heat shield 300 includes the flow path portion 303 through which the cooling medium flows. The cooling medium suppresses thermal deformation of the heat shield 300.

Here, in the present embodiment, as illustrated in FIG. 8, the first peripheral gas supply ports 83a supply the etching gas in the direction from the peripheral portion of the reflection surface 75a toward the inner side of the reflection surface 75a. The direction in the present embodiment toward the inner side of the reflection surface 75a from the outer side of the reflection surface 75a is inclined at the inclination angle $\theta 1$ with respect to the first straight line L1 as described above. Even in this case, similarly to the comparative example, the first peripheral gas supply ports 83a are not formed as facing the inner wall 10b of the chamber device 10, but are formed as facing the inner side of the reflection surface 75a. Therefore, it can be understood that the first peripheral gas supply ports 83a supply the etching gas in the direction approaching the focal line L0. Although description has been provided here on the first peripheral gas supply ports 83a, it can be understood that the second peripheral gas supply ports 85a and the third peripheral gas supply ports 87a also supply the etching gas in the direction approaching the focal line L0.

Further, as illustrated in FIG. 9, the second peripheral gas supply ports 85a supply the etching gas in the direction from the peripheral portion of the reflection surface 75a toward the inner side of the reflection surface 75a. The direction in the present embodiment toward the inner side of the reflection surface 75a from the outer side of the reflection surface 75a is inclined at the inclination angle $\theta 2$ with respect to the second straight line L2. Even in this case, similarly to the first peripheral gas supply ports 83a, the second peripheral gas supply ports 85a are not formed as facing the inner wall 10b of the chamber device 10, but are formed as facing the inner side of the reflection surface 75a. Therefore, as illustrated in FIG. 9, when the second peripheral gas supply ports 85a for supplying the etching gas is viewed from the direction perpendicular to the focal line L0 as illustrated in FIG. 7, it can be understood that the second peripheral gas supply ports 85a supply the etching gas in the direction toward the plasma generation region AR. In this case, the etching gas from the second peripheral gas supply ports 85a flows in the direction away from the reflection surface 75a along the focal line L0 together with the etching gas from the central gas supply port 81a passing through the plasma generation region AR. Therefore, the etching gas from the second peripheral gas supply ports 85a can cause the residual gas generated from the plasma generation region AR to flow toward the exhaust port 10E together with the etching gas from the central gas supply port 81a.

Further, in the present embodiment, the plurality of first peripheral gas supply ports 83a are formed, but not limited thereto, at least one first peripheral gas supply port 83a may be formed. Further, although the respective first peripheral gas supply ports 83a are inclined at the same inclination angle θ1, it is not necessarily limited thereto. At least one first peripheral gas supply port 83a may be inclined at an inclination angle θ1. The inclination angle θ1 of some part of the first peripheral gas supply ports 83a may be different from the inclination angle θ1 of some other part of the first peripheral gas supply ports 83a. The first peripheral gas supply ports 83a do not need to be formed at equal intervals in the circumferential direction of the circle. Although description has been provided here on the first peripheral gas supply ports 83a, the second peripheral gas supply ports 85a and the third peripheral gas supply ports 87a may be formed similarly to the first peripheral gas supply ports 83a. Further, the number of the second peripheral gas supply ports 85a and the number of the third peripheral gas supply ports 87a are the same as the number of the first peripheral gas supply ports 83a, but they are not necessarily limited thereto. The number of the first peripheral gas supply ports 83a, the number of the second peripheral gas supply ports 85a, and the number of the third peripheral gas supply ports 87a may be different from one another. The first peripheral gas supply ports 83a, the second peripheral gas supply ports 85a, and the third peripheral gas supply ports 87a may be formed as being stacked when viewed along the focal line L0, or may be arranged so as to be shifted in the direction around the axis of the focal line L0.

Further, the cylindrical heat shield 300 may accommodate the plasma generation region AR. In this case, the heat shield 300 is disposed between the plasma generation region AR and the target collection unit 14 and between the plasma generation region AR and the nozzle 42. A pair of passage holes (not illustrated) disposed on a travel path of the droplet DL are formed at the heat shield 300. The droplet DL passes through the passage holes and travels to the target collection unit 14.

5. Description of EUV Light Generation Apparatus of Embodiment 2

Next, a configuration of the EUV light generation apparatus 100 of Embodiment 2 will be described. Any component same as that described above is denoted by an identical reference sign, and duplicate description thereof is omitted unless specific description is needed.

5.1 Configuration

Figure 11:
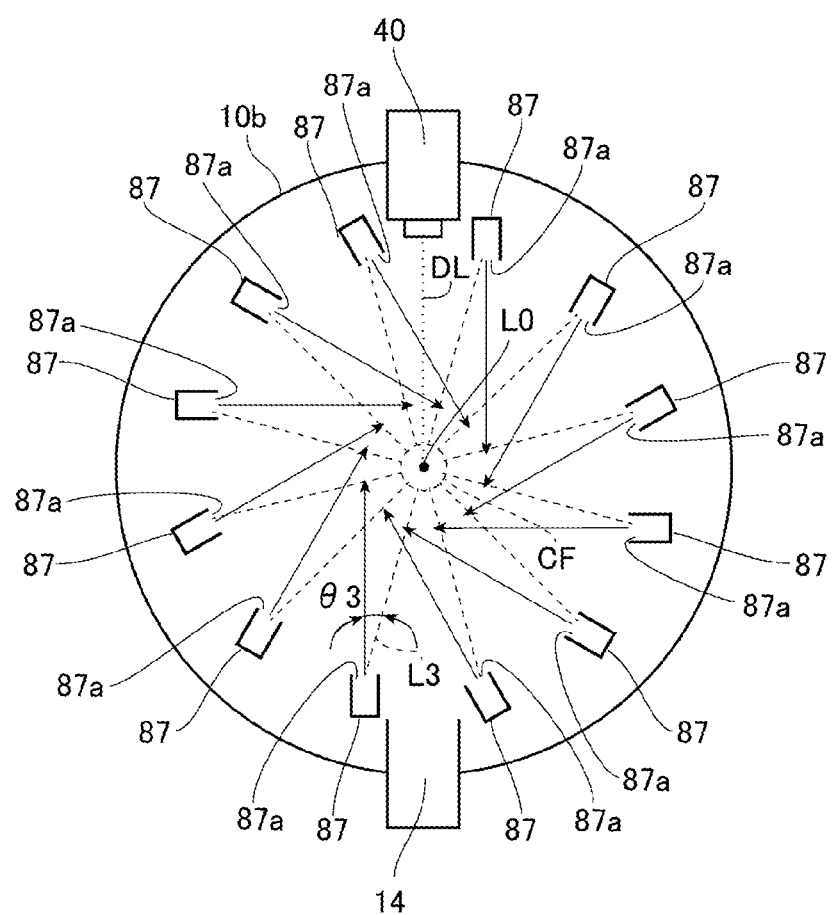
FIG. 11 is a view of a configuration of a plurality of the third peripheral gas supply ports in Embodiment 2 as viewed along the focal line.

FIG. 11 is a view of a configuration of the plurality of third peripheral gas supply ports 87a in the present embodiment as viewed along the focal line L0. In the chamber device 10 of the present embodiment, arrangement of the third peripheral gas supply ports 87a is different from arrangement of the third peripheral gas supply ports 87a of Embodiment 1.

In the present embodiment, the inclination angle θ3 of the third peripheral gas supply ports 87a is smaller than each of the inclination angle θ1 of the first peripheral gas supply ports 83a and the inclination angle θ2 of the second peripheral gas supply ports 85a.

In the present embodiment, the inclination angle θ1 is assumed to be the same as the inclination angle θ2.

5.2 Effect

The third peripheral gas supply ports 87a supply the etching gas in the direction more away from the trajectory of the droplet DL than the first peripheral gas supply ports 83a and the second peripheral gas supply ports 85a. Therefore, flow of the etching gas from the third peripheral gas supply ports 87a has less influence on the trajectory of the droplet DL as compared with flow of the etching gas from the first peripheral gas supply ports 83a and flow from the second peripheral gas supply ports 85a of the etching gas. This influence includes, for example, fluctuation of the trajectory of the droplet DL due to the flow of the etching gas. Owing to that the inclination angle θ3 is smaller than each of the inclination angle θ1 and the inclination angle θ2, it is possible to increase the gas pressure of the etching gas when the etching gas is supplied to the internal space of the chamber device 10 without affecting the trajectory of the droplet DL, as compared with a case where the inclination angle θ3 is not smaller than each of the inclination angle θ1 and the inclination angle θ2. Therefore, the residual gas in the internal space of the chamber device 10 can be caused to easily flow toward the exhaust port 10E.

In the present embodiment, similarly to the comparative example, the third peripheral gas supply ports 87a may supply the etching gas toward the focal line L0 without being inclined with respect to the third straight line L3.

6. Description of EUV Light Generation Apparatus of Embodiment 3

Next, a configuration of an EUV light generation apparatus 100 of Embodiment 3 will be described. Any component same as that described above is denoted by an identical reference sign, and duplicate description thereof is omitted unless specific description is needed.

6.1 Configuration

Figure 12:
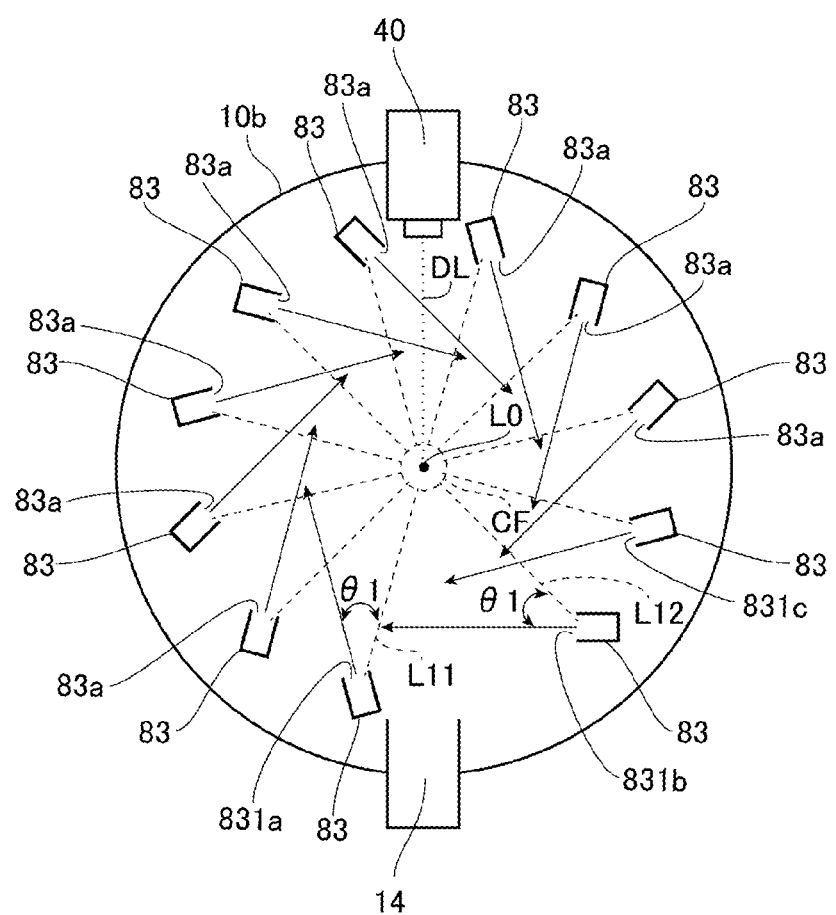
FIG. 12 is a view of a configuration of a plurality of the first peripheral gas supply ports in Embodiment 3 as viewed along the focal line.

FIG. 12 is a view of a configuration of the plurality of first peripheral gas supply ports 83a in the present embodiment as viewed along the focal line L0. In the chamber device 10 of the present embodiment, arrangement of the third peripheral gas supply ports 87a is different from arrangement of the third peripheral gas supply ports 87a of the first embodiment.

Here, for convenience of description, a part of the plurality of first peripheral gas supply ports 83a will be referred to as a first supply port 831a, another part thereof will be referred to as a second supply port 831b, and still another part thereof will be referred to as a third supply port 831c.

The first supply port 831a is formed adjacent to the second supply port 831b, and the third supply port 831c is formed adjacent to the second supply port 831b on the side opposite to the first supply port 831a with respect to the second supply port 831b. In the direction around the axis of the focal line L0, length between the first supply port 831a and the second supply port 831b is longer than length between the second supply port 831b and the third supply port 831c. The first supply port 831a, the second supply port 831b, and the third supply port 831c are inclined toward the same direction. When viewed along the focal line L0, the first supply port 831a supplies the etching gas to the side opposite to the second supply port 831b with respect to a first straight line L11 passing through the first supply port 831a and the focal line L0, and the second supply port 831b supplies the etching gas to the side opposite to the third supply port 831c with respect to a second straight line L12 passing through the second supply port 831b and the focal line L0. Further, each of the first supply ports 831a, the second supply ports 831b, and the third supply ports 831c supplies the etching gas so that the etching gas supplied therefrom swirls around the etched gas from the central gas supply port 81*a*. Therefore, the first supply port 831*a* is formed on the upstream side of the second supply port 831*b* in the swirl direction, and the second supply port 831*b* is provided on the upstream side of the third supply port 831*c* in the swirl direction.

The inclination angle θ1 of the second supply port 831*b* is larger than the inclination angle θ1 of the first supply port 831*a*.

6.2 Effect

There may be a case that each of the first peripheral gas supply ports 83*a* may not be formed at equal intervals on the circumference of the same circle with reference to the focal line L0 due to layout constraints. For example, since openings such as the nozzle 42 of the target supply unit 40 and the target collection unit 14 are disposed on a surface passing through the plasma generation region AR, the openings are disposed on the same surface as the first peripheral gas supply port 83*a*. In this case, since the inclination angle θ1 of the second supply port 831*b* becomes larger than the inclination angle θ1 of the first supply port 831*a*, it is possible to suppress a decrease in the uniformity of the flow of the swirling etching gas as compared with the case where the first peripheral gas supply ports 83*a* are not formed at equal intervals. Accordingly, vibration of the droplet DL can be suppressed.

Figure 13:
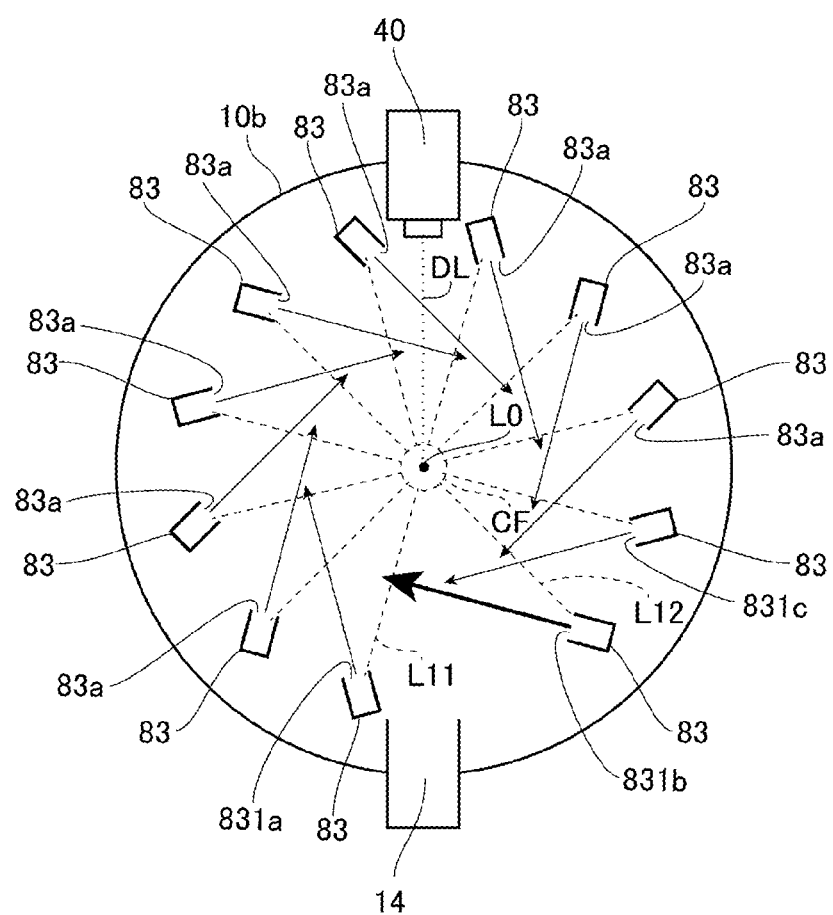
FIG. 13 is a view of a configuration of a plurality of the first peripheral gas supply ports in a modification of Embodiment 3 as viewed along the focal line.
Figure 14:
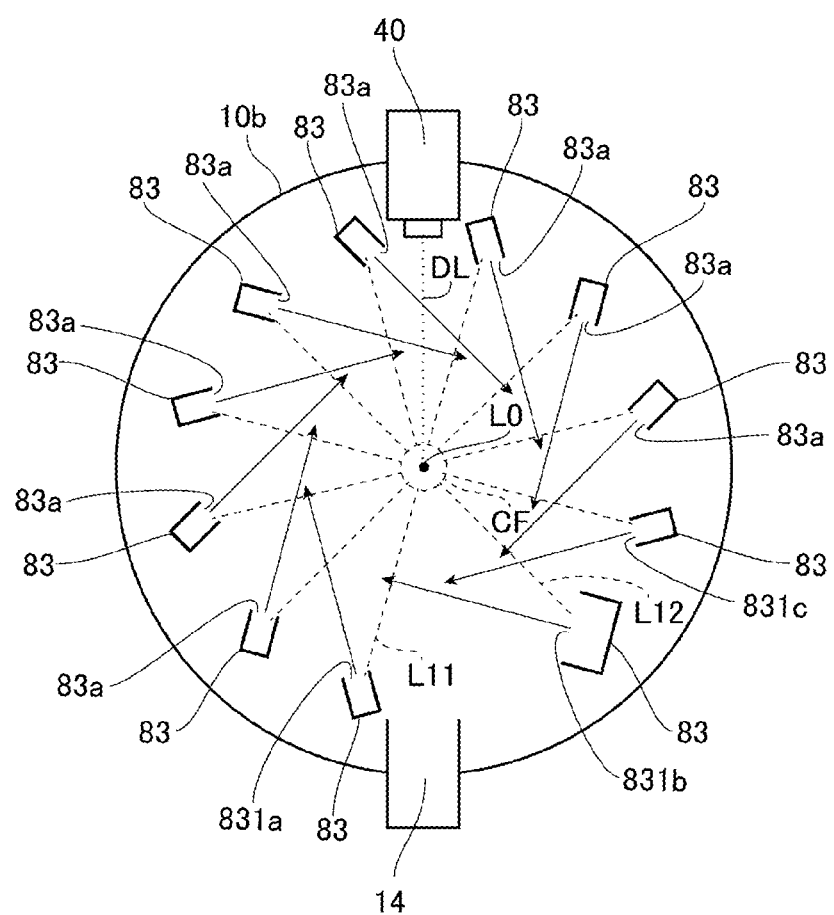
FIG. 14 is a view of a configuration of a plurality of the first peripheral gas supply ports in a modification of Embodiment 3 as viewed along the focal line.
Figure 15:
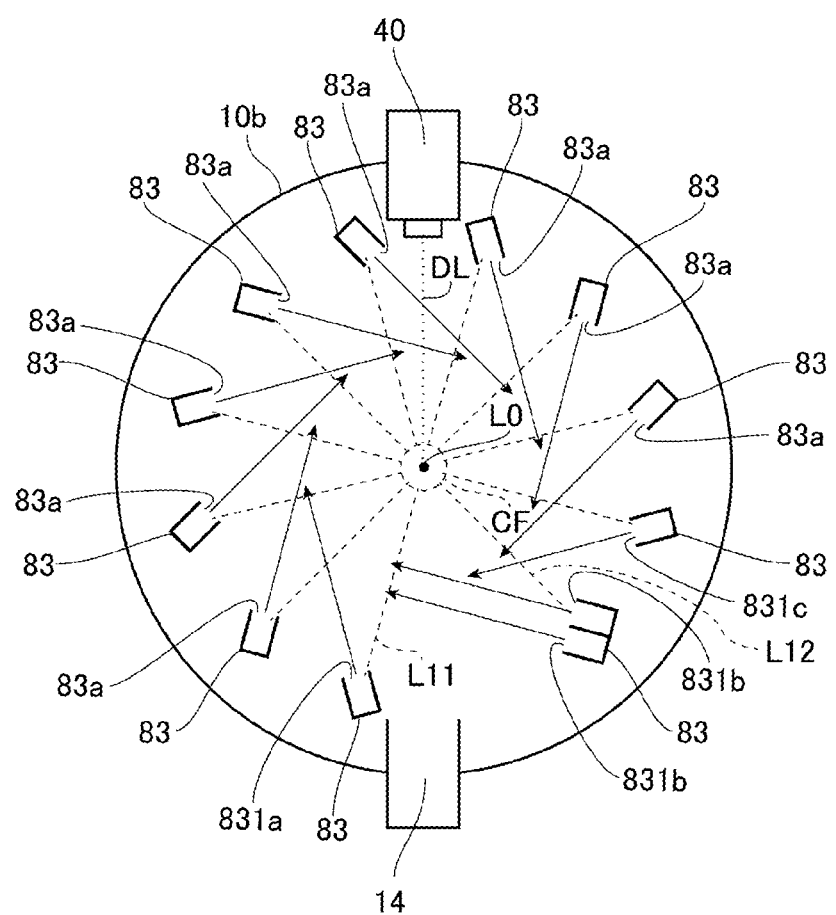
FIG. 15 is a view of a configuration of a plurality of the first peripheral gas supply ports in a modification of Embodiment 3 as viewed along the focal line.

As a modification of the present embodiment, as illustrated in FIG. 13, a flow rate of the etching gas from the second supply port 831*b* may be higher than a flow rate of the etching gas from the first supply port 831*a*. In FIG. 13, a thicker arrow from the supply port indicates that the flow rate of the etching gas from the supply port is larger. Further, as a modification, as illustrated in FIG. 14, opening cross-sectional area of the second supply port 831*b* may be larger than opening cross-sectional area of the first supply port 831*a*. Further, as a modification, as illustrated in FIG. 15, the number of the second supply ports 831*b* may be larger than the number of the first supply ports 831*a*. Even in each of the modifications, operation and effects same as those of the third embodiment can be obtained.

Here, in a modification of the present embodiment, there may be formed a plurality of the first supply ports 831*a*, a plurality of the second supply ports 831*b*, and a plurality of the third supply ports 831*c*.

Description has been provided on the third embodiment and the modifications using the first peripheral gas supply ports 83*a*, but not limited thereto, operation and effects similar thereto can be obtained as well for the second peripheral gas supply ports 85*a* and the third peripheral gas supply ports 87*a*. Therefore, in the peripheral gas supply ports, which are at least any of the first peripheral gas supply ports 83*a*, the second peripheral gas supply ports 85*a*, and the third peripheral gas supply ports 87*a*, the inclination angle of the second supply port may be larger than the inclination angle of the first supply port, the flow rate of the gas from the second supply port may be larger than the flow rate of the gas from the first supply port, the opening cross-sectional area of the second supply port may be larger than the opening cross-sectional area of the first supply port, and the number of the second supply ports may be larger than the number of the first supply ports.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus, comprising:
    a chamber device including a plasma generation region in which plasma is generated from a droplet to which laser light is radiated;
    a concentrating mirror disposed in the chamber device as including a spheroidal reflection surface configured to reflect extreme ultraviolet light generated from the plasma in the plasma generation region;
    a central gas supply port configured to supply gas along a focal line passing through a first focal point and a second focal point of the reflection surface from a center side of the reflection surface; and
    a first peripheral gas supply port disposed at a peripheral portion of the reflection surface and configured to supply gas in a direction toward an inner side of the reflection surface from an outer side of the reflection surface,
    the first peripheral gas supply port being configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

2. The extreme ultraviolet light generation apparatus according to claim 1, wherein the first peripheral gas supply port supplies the gas along the reflection surface from the peripheral portion.

3. The extreme ultraviolet light generation apparatus according to claim 2, further comprising a second peripheral gas supply port configured to supply gas along the direction toward the inner side of the reflection surface from the outer side of the reflection surface,
    wherein the second peripheral gas supply port is formed on a side opposite to the reflection surface with respect to the first peripheral gas supply port, and
    the second peripheral gas supply port supplies the gas, when viewed along the focal line, in an inclined direction inclined to a tangential direction side of the peripheral portion at the peripheral portion where the second peripheral gas supply port is located with respect to a second straight line passing through the second peripheral gas supply port and the focal line.

4. The extreme ultraviolet light generation apparatus according to claim 3, wherein the second peripheral gas supply port supplies the gas in a direction toward the plasma generation region when viewed from a direction perpendicular to the focal line.

5. The extreme ultraviolet light generation apparatus according to claim 3,
wherein an inclination angle of the first peripheral gas supply port with respect to the first straight line is the same as an inclination angle of the second peripheral gas supply port with respect to the second straight line, and
the second peripheral gas supply port is formed inclined toward the same direction side as the first peripheral gas supply port when viewed along the focal line.

6. The extreme ultraviolet light generation apparatus according to claim 3,
wherein a plurality of the first peripheral gas supply ports are formed,
inclination angles of the respective first peripheral gas supply ports with respect to the corresponding first straight line are identical to each other, and
the respective first peripheral gas supply ports are inclined toward the same direction side when viewed along the focal line.

7. The extreme ultraviolet light generation apparatus according to claim 3,
wherein a plurality of the second peripheral gas supply ports are formed,
the inclination angles of the second peripheral gas supply ports with respect to the corresponding second straight line are identical to each other,
the respective first peripheral gas supply ports are inclined toward the same direction side when viewed along the focal line.

8. The extreme ultraviolet light generation apparatus according to claim 3, further comprising a third peripheral gas supply port disposed on a side opposite to the first peripheral gas supply port with respect to the second peripheral gas supply port and configured to supply gas along the direction toward the inner side of the reflection surface from the outer side of the reflection surface,
wherein the third peripheral gas supply port supplies the gas in a direction away from the reflection surface when viewed from the direction perpendicular to the focal line.

9. The extreme ultraviolet light generation apparatus according to claim 8,
wherein the third peripheral gas supply port supplies the gas, when viewed along the focal line, in an inclined direction inclined to a tangential direction side of the peripheral portion at the peripheral portion where the third peripheral gas supply port is located with respect to a third straight line passing through the third peripheral gas supply port and the focal line.

10. The extreme ultraviolet light generation apparatus according to claim 9,
wherein an inclination angle of the third peripheral gas supply port with respect to the third straight line is smaller than each of an inclination angle of the first peripheral gas supply port with respect to the first straight line and an inclination angle of the second peripheral gas supply port with respect to the second straight line when viewed along the focal line.

11. The extreme ultraviolet light generation apparatus according to claim 8,
wherein the third peripheral gas supply port supplies the gas toward the focal line when viewed along the focal line.

12. The extreme ultraviolet light generation apparatus according to claim 8,
wherein a plurality of peripheral gas supply ports are formed, the peripheral gas supply ports being at least any of the first peripheral gas supply ports, the second peripheral gas supply ports, and the third peripheral gas supply ports,
the first supply port among the plurality of peripheral gas supply ports is formed adjacent to the second supply port among the plurality of the peripheral gas supply ports,
the third supply port among the plurality of peripheral gas supply ports is formed adjacent to the second supply port on the side opposite to the first supply port with respect to the second supply port,
length between the first supply port and the second supply port is longer than the length between the second supply port and the third supply port,
the first supply port, the second supply port, and the third supply port are inclined toward the same direction,
the first supply port supplies the gas to a side opposite to the second supply port with reference to a first straight line passing through the first supply port and the focal line, and the second supply port supplies the gas to a side opposite to the third supply port with reference to a second straight line passing through the second supply port and the focal line, when viewed along the focal line, and
an inclination angle of the second supply port with respect to the second straight line is larger than an inclination angle of the first supply port with respect to the first straight line.

13. The extreme ultraviolet light generation apparatus according to claim 8,
wherein a plurality of peripheral gas supply ports are formed, the peripheral gas supply ports being at least any of the first peripheral gas supply ports, the second peripheral gas supply ports, and the third peripheral gas supply ports,
the first supply port among the plurality of peripheral gas supply ports is formed adjacent to the second supply port among the plurality of the peripheral gas supply ports,
the third supply port among the plurality of peripheral gas supply ports is formed adjacent to the second supply port on the side opposite to the first supply port with respect to the second supply port,
length between the first supply port and the second supply port is longer than the length between the second supply port and the third supply port,
the first supply port, the second supply port, and the third supply port are inclined toward the same direction,
the first supply port supplies the gas to a side opposite to the second supply port with reference to a first straight line passing through the first supply port and the focal line, and the second supply port supplies the gas to a side opposite to the third supply port with reference to a second straight line passing through the second supply port and the focal line, when viewed along the focal line, and
a flow rate of the gas from the second supply port is higher than a flow rate of the gas from the first supply port.

14. The extreme ultraviolet light generation apparatus according to claim 8,
wherein a plurality of peripheral gas supply ports are formed, the peripheral gas supply ports being at least any of the first peripheral gas supply ports, the second peripheral gas supply ports, and the third peripheral gas supply ports, the first supply port among the plurality of peripheral gas supply ports is formed adjacent to the second supply port among the plurality of the peripheral gas supply ports, the third supply port among the plurality of peripheral gas supply ports is formed adjacent to the second supply port on the side opposite to the first supply port with respect to the second supply port, length between the first supply port and the second supply port is longer than the length between the second supply port and the third supply port, the first supply port, the second supply port, and the third supply port are inclined toward the same direction, the first supply port supplies the gas to a side opposite to the second supply port with reference to a first straight line passing through the first supply port and the focal line, and the second supply port supplies the gas to a side opposite to the third supply port with reference to a second straight line passing through the second supply port and the focal line, when viewed along the focal line, and opening cross-sectional area of the second supply port is larger than opening cross-sectional area of the first supply port.

15. The extreme ultraviolet light generation apparatus according to claim 8, wherein a plurality of peripheral gas supply ports are formed, the peripheral gas supply ports being at least any of the first peripheral gas supply ports, the second peripheral gas supply ports, and the third peripheral gas supply ports, the first supply port among the plurality of peripheral gas supply ports is formed adjacent to the second supply port among the plurality of the peripheral gas supply ports, the third supply port among the plurality of peripheral gas supply ports is formed adjacent to the second supply port on the side opposite to the first supply port with respect to the second supply port, length between the first supply port and the second supply port is longer than the length between the second supply port and the third supply port, the first supply port, the second supply port, and the third supply port are inclined toward the same direction, the first supply port supplies the gas to a side opposite to the second supply port with reference to a first straight line passing through the first supply port and the focal line, and the second supply port supplies the gas to a side opposite to the third supply port with reference to a second straight line passing through the second supply port and the focal line, when viewed along the focal line, and the number of the second supply ports is larger than the number of the first supply ports.

16. The extreme ultraviolet light generation apparatus according to claim 1, wherein the chamber device further includes a heat shield disposed at a space with respect to the plasma generation region, and the heat shield includes a flow path portion through which a cooling medium flows.

17. An extreme ultraviolet light generation system, comprising:
a chamber device including a plasma generation region in which plasma is generated from a droplet to which laser light is radiated;
a laser device configured to irradiate the droplet with the laser light in the plasma generation region;
a concentrating mirror disposed in the chamber device as including a spheroidal reflection surface configured to reflect extreme ultraviolet light generated from the plasma in the plasma generation region;
a central gas supply port configured to supply gas along a focal line passing through a first focal point and a second focal point of the reflection surface from a center side of the reflection surface; and
a first peripheral gas supply port disposed at a peripheral portion of the reflection surface and configured to supply gas along a direction toward an inner side of the reflection surface from an outer side of the reflection surface,
the first peripheral gas supply port being configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

18. An electronic device manufacturing method, comprising:
generating plasma by irradiating a droplet with laser light using an extreme ultraviolet light generation apparatus;
emitting the extreme ultraviolet light generated from the plasma to the exposure apparatus; and
exposing a photosensitive substrate to the extreme ultraviolet light in the exposure apparatus to produce an electronic device,
the extreme ultraviolet light generation apparatus including:
a chamber device including a plasma generation region in which plasma is generated from the droplet to which the laser light is radiated;
a concentrating mirror disposed in the chamber device as including a spheroidal reflection surface configured to reflect extreme ultraviolet light generated from the plasma in the plasma generation region;
a central gas supply port configured to supply gas along a focal line passing through a first focal point and a second focal point of the reflection surface from a center side of the reflection surface; and
a first peripheral gas supply port disposed at a peripheral portion of the reflection surface and configured to supply gas along a direction toward an inner side of the reflection surface from an outer side of the reflection surface;
the first peripheral gas supply port being configured to supply the gas, when viewed along the focal line, in an inclined direction inclined to a tangential direction side of the peripheral portion at the peripheral portion where the first peripheral gas supply port is located with respect to a first straight line passing through the first peripheral gas supply port and the focal line.

* * * * *